(12) United States Patent
Hanajima et al.

(10) Patent No.: US 11,521,867 B2
(45) Date of Patent: Dec. 6, 2022

(54) CUTTING APPARATUS

(71) Applicant: DISCO CORPORATION, Tokyo (JP)

(72) Inventors: Satoshi Hanajima, Tokyo (JP); Takeshi Kitaura, Tokyo (JP); Natsuko Hanamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 607 days.

(21) Appl. No.: 16/710,850

(22) Filed: Dec. 11, 2019

(65) Prior Publication Data
US 2020/0185239 A1    Jun. 11, 2020

(30) Foreign Application Priority Data

Dec. 11, 2018   (JP) .............................. JP2018-231648

(51) Int. Cl.
| | |
|---|---|
| *H01L 21/67* | (2006.01) |
| *H01L 21/677* | (2006.01) |
| *H01L 21/78* | (2006.01) |
| *H01L 21/687* | (2006.01) |
| *B23C 3/28* | (2006.01) |

(Continued)

(52) U.S. Cl.
CPC .......... *H01L 21/67092* (2013.01); *B23C 3/28* (2013.01); *B24B 19/02* (2013.01); *B26D 3/06* (2013.01); *B28D 5/0076* (2013.01); *B28D 5/023* (2013.01); *H01L 21/67051* (2013.01); *H01L 21/6773* (2013.01); *H01L 21/67748* (2013.01);

(Continued)

(58) Field of Classification Search
CPC ......... H01L 21/67011; H01L 21/67739; H01L 21/67745–67757; B26D 3/06; B28D 5/023; B28D 5/0076
See application file for complete search history.

(56) References Cited

U.S. PATENT DOCUMENTS

| | | | |
|---|---|---|---|
| 7,329,079 B2* | 2/2008 | Ohkawara | ............. H01L 21/681 414/217 |
| 7,338,345 B2* | 3/2008 | Fujinami | ................ B28D 5/029 451/6 |

(Continued)

FOREIGN PATENT DOCUMENTS

| | | |
|---|---|---|
| JP | 2001110756 A | 4/2001 |
| JP | 2005046979 A | 2/2005 |
| JP | 2017130515 A | 7/2017 |

OTHER PUBLICATIONS

Office Action issued in counterpart German patent application No. 10 2019 219 223.8, dated Jun. 29, 2022.

*Primary Examiner* — Jason Daniel Prone
*Assistant Examiner* — Richard D Crosby, Jr.
(74) *Attorney, Agent, or Firm* — Greer Burns & Crain Ltd.

(57) ABSTRACT

A cutting apparatus includes a cassette table on which a first cassette in which a frame unit, ring-shaped frame and wafer are housed, and a second cassette in which a simple wafer is housed. A first conveying unit having a first frame holding part holds the ring-shaped frame of the frame unit withdrawn from the first cassette and conveys the frame unit to a chuck table. A first wafer holding part holds the simple wafer withdrawn from the second cassette and conveys the simple wafer to the chuck table. A cutting unit cuts the wafer, and a second conveying unit conveys the frame unit from the chuck table to a cleaning unit. A second wafer holding part holds the cut simple wafer and conveys it from the chuck table to the cleaning unit.

8 Claims, 8 Drawing Sheets

(51) Int. Cl.
*B24B 19/02* (2006.01)
*B26D 3/06* (2006.01)
*B28D 5/00* (2006.01)
*B28D 5/02* (2006.01)

(52) U.S. Cl.
CPC ........ *H01L 21/68721* (2013.01); *H01L 21/78* (2013.01); *Y10T 83/0207* (2015.04)

(56) References Cited

U.S. PATENT DOCUMENTS

| | | | |
|---|---|---|---|
| 8,116,893 B2* | 2/2012 | Tsushima | B28D 5/029 |
| | | | 382/145 |
| 8,657,648 B2* | 2/2014 | Yamanaka | H01L 21/304 |
| | | | 451/333 |
| 8,815,644 B2* | 8/2014 | Priewasser | H01L 21/6836 |
| | | | 438/464 |
| 9,396,976 B2* | 7/2016 | Kozai | H01L 21/67092 |
| 9,508,570 B2* | 11/2016 | Cheng | B28D 5/029 |
| 11,171,056 B2* | 11/2021 | Yamamoto | H01L 22/12 |
| 11,173,631 B2* | 11/2021 | Fukuoka | B28D 5/023 |
| 2001/0040197 A1* | 11/2001 | Sekiya | B28D 5/0094 |
| | | | 241/301 |
| 2004/0265100 A1 | 12/2004 | Ohkawara et al. | |
| 2005/0118938 A1* | 6/2005 | Mizomoto | B24B 7/228 |
| | | | 451/65 |
| 2006/0112802 A1* | 6/2006 | Fujinami | B28D 5/029 |
| | | | 83/310 |
| 2008/0102542 A1* | 5/2008 | Negishi | H01L 21/67253 |
| | | | 257/E21.53 |
| 2008/0285021 A1* | 11/2008 | Sekiya | G01N 21/94 |
| | | | 356/237.4 |
| 2012/0088354 A1* | 4/2012 | Furuta | B23K 26/40 |
| | | | 257/E21.599 |
| 2016/0343599 A1 | 11/2016 | Nakamura | |
| 2019/0378732 A1* | 12/2019 | Hanajima | H01L 21/67253 |
| 2020/0391410 A1* | 12/2020 | Fukuoka | B28D 5/0076 |

* cited by examiner

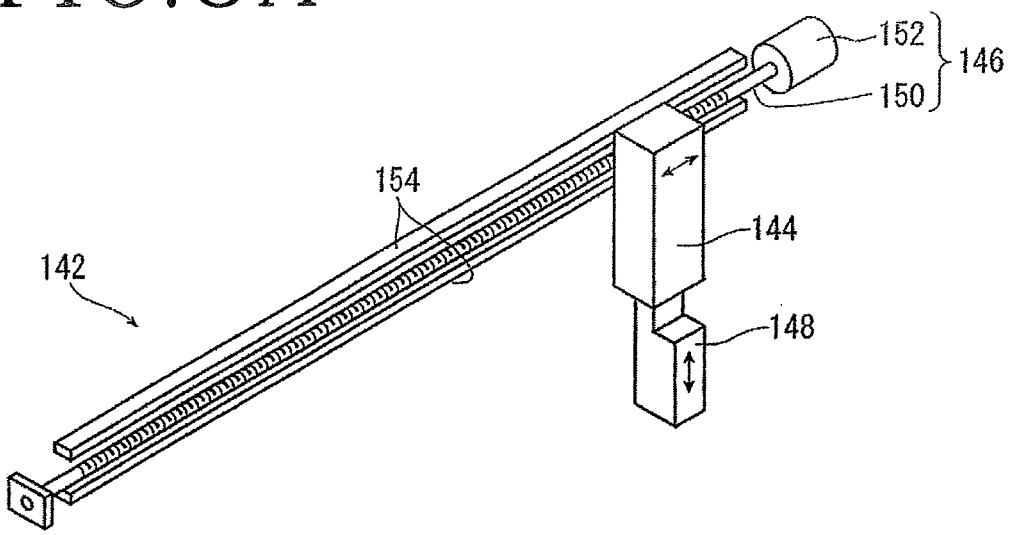
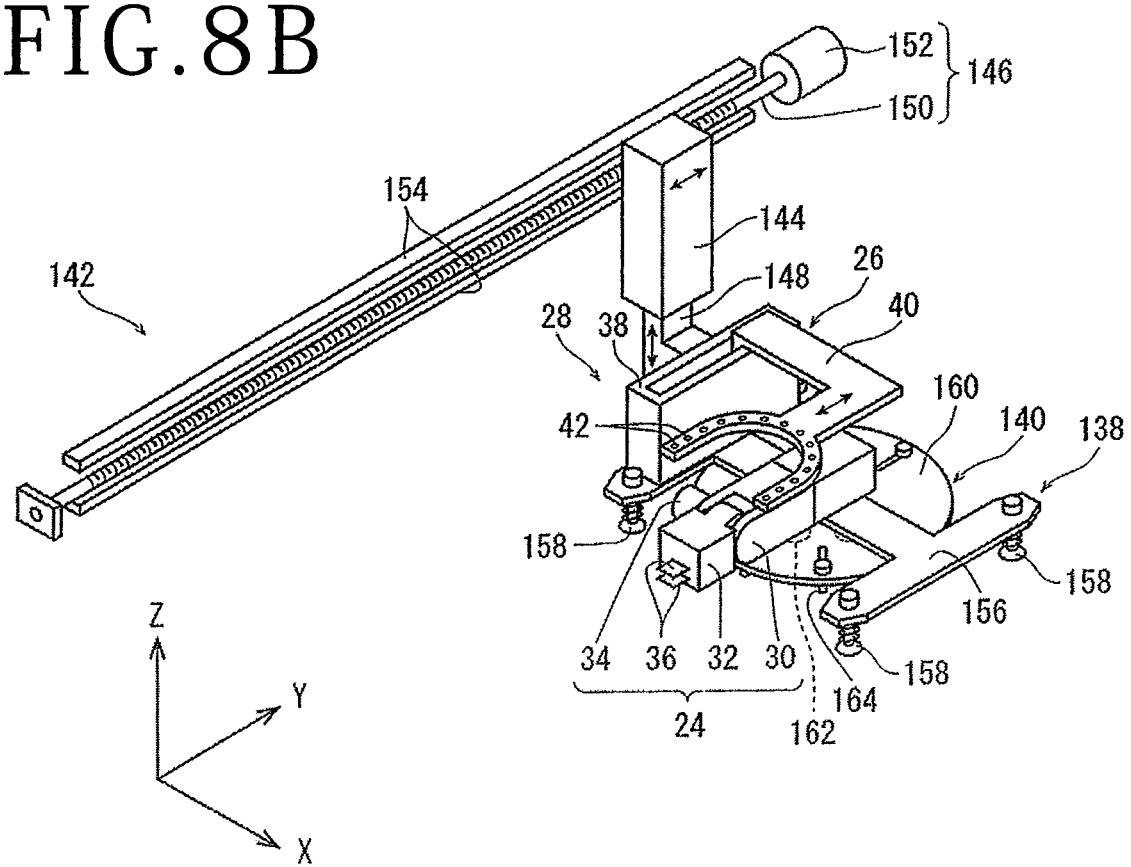

CUTTING APPARATUS

BACKGROUND OF THE INVENTION

Field of the Invention

The present invention relates to a cutting apparatus that cuts a wafer.

Description of the Related Art

A wafer on which plural devices such as integrated circuits (ICs) and large scale integrations (LSIs) are marked out by intersecting plural planned dividing lines and are formed on a surface is divided into individual device chips by a cutting apparatus, and the respective device chips obtained by the dividing are used for pieces of electrical equipment such as mobile phones and personal computers. The wafer is disposed in a ring-shaped frame having an opening that houses the wafer with the intermediary of an adhesion tape and is completely cut along the planned dividing lines by the cutting apparatus to be divided into the individual device chips (for example refer to Japanese Patent Laid-open No. 2001-110756).

Furthermore, in the case of executing a technique referred to as so-called dicing first (dicing before grinding), in which cut grooves with a depth equivalent to the thickness of device chips are formed in planned dividing lines of a wafer as a simple component (hereinafter, referred to as simple wafer) and thereafter a protective tape is stuck to the front surface of the wafer and the back surface is ground until the cut grooves appear in the back surface of the wafer to divide the wafer into individual device chips, the cut grooves with the depth equivalent to the thickness of the device chips are formed in the planned dividing lines by a cutting apparatus and the wafer is incompletely cut (for example refer to Japanese Patent Laid-open No. 2005-46979).

SUMMARY OF THE INVENTION

However, the cutting apparatus is different between the case of completely cutting the wafer disposed in the ring-shaped frame with the intermediary of the adhesion tape and the case of incompletely cutting the simple wafer. Thus, there is a problem that two kinds of cutting apparatuses need to be prepared, which is uneconomical, and the setting area of the cutting apparatuses increases.

Thus, an object of the present invention is to provide a cutting apparatus that allows complete cutting and incomplete cutting of wafers to be carried out by one cutting apparatus.

In accordance with an aspect of the present invention, there is provided a cutting apparatus that cuts a wafer. The cutting apparatus includes a cassette table on which a first cassette in which a frame unit, in which a wafer is positioned in an opening of a ring-shaped frame having the opening and the ring-shaped frame and the wafer are integrated by an adhesion tape, is housed and a second cassette in which a simple wafer is housed are selectively placed, and a withdrawing unit selectively including a clamping part that clamps the ring-shaped frame and withdraws the frame unit from the first cassette when the first cassette is placed on the cassette table and a support part that supports the simple wafer and withdraws the simple wafer from the second cassette when the second cassette is placed on the cassette table. The cutting apparatus includes also a first temporary putting unit on which the frame unit withdrawn by the clamping part of the withdrawing unit is temporarily put, a second temporary putting unit on which the simple wafer withdrawn by the support part of the withdrawing unit is temporarily put, and a first conveying unit including a first frame holding part that holds the ring-shaped frame of the frame unit positioned at the first temporary putting unit and conveys the frame unit to a chuck table and a first wafer holding part that holds the simple wafer positioned at the second temporary putting unit and conveys the simple wafer to the chuck table. The cutting apparatus includes also a cutting unit that cuts the wafer of the frame unit or the simple wafer held by the chuck table, a cleaning unit that holds and cleans the wafer of the frame unit or the simple wafer that has been cut, and a second conveying unit including a second frame holding part that holds the ring-shaped frame of the frame unit of the cut wafer and conveys the frame unit from the chuck table to the cleaning unit and a second wafer holding part that holds the cut simple wafer and conveys the simple wafer from the chuck table to the cleaning unit.

Preferably, the first frame holding part of the first conveying unit holds the ring-shaped frame of the frame unit cleaned by the cleaning unit and conveys the frame unit from the cleaning unit to the first temporary putting unit, and the first wafer holding part of the first conveying unit holds the simple wafer cleaned by the cleaning unit and conveys the simple wafer from the cleaning unit to the support part of the withdrawing unit.

Preferably, the second temporary putting unit includes a detecting part that detects a crystal orientation of the simple wafer.

Preferably, the first frame holding part of the first conveying unit and the second frame holding part of the second conveying unit suck and hold the ring-shaped frame, and the first wafer holding part of the first conveying unit and the second wafer holding part of the second conveying unit blow air to the simple wafer to generate a negative pressure and hold the simple wafer in a contactless manner.

Preferably, by the cutting unit, the wafer of the frame unit is completely cut and the simple wafer is incompletely cut.

Preferably, the second conveying unit includes the withdrawing unit.

Preferably, the first temporary putting unit has a pair of guide rails that are selectively positioned to a closing position at which the pair of guide rails support the frame unit and an opening position with which the frame unit is released, and the frame unit withdrawn from the first cassette is supported by the pair of guide rails positioned at the closing position and, after the supporting, the frame unit is held by the first frame holding part of the first conveying unit and the pair of guide rails are positioned to the opening position, and the frame unit is conveyed to the chuck table positioned directly under the first temporary putting unit.

Preferably, the second temporary putting unit is disposed on an upper side and on a side of the cassette table relative to the first temporary putting unit, and the simple wafer that has been withdrawn from the second cassette by the support part of the withdrawing unit and been positioned at the second temporary putting unit is, after detection of a notch, supported by the support part again and is held by the first wafer holding part of the first conveying unit to be conveyed to the chuck table positioned directly under the first temporary putting unit.

According to the present invention, complete cutting and incomplete cutting of wafers can be carried out by one cutting apparatus, which is economical. In addition, increase in the setting area of the cutting apparatus can be suppressed.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 8A is a perspective view of a second conveying unit depicted in FIG. 1; and FIG. 8B is a perspective view of the state in which a second frame holding part and a second wafer holding part are mounted on the second conveying unit.

DETAILED DESCRIPTION OF THE PREFERRED EMBODIMENT

Figure 1:
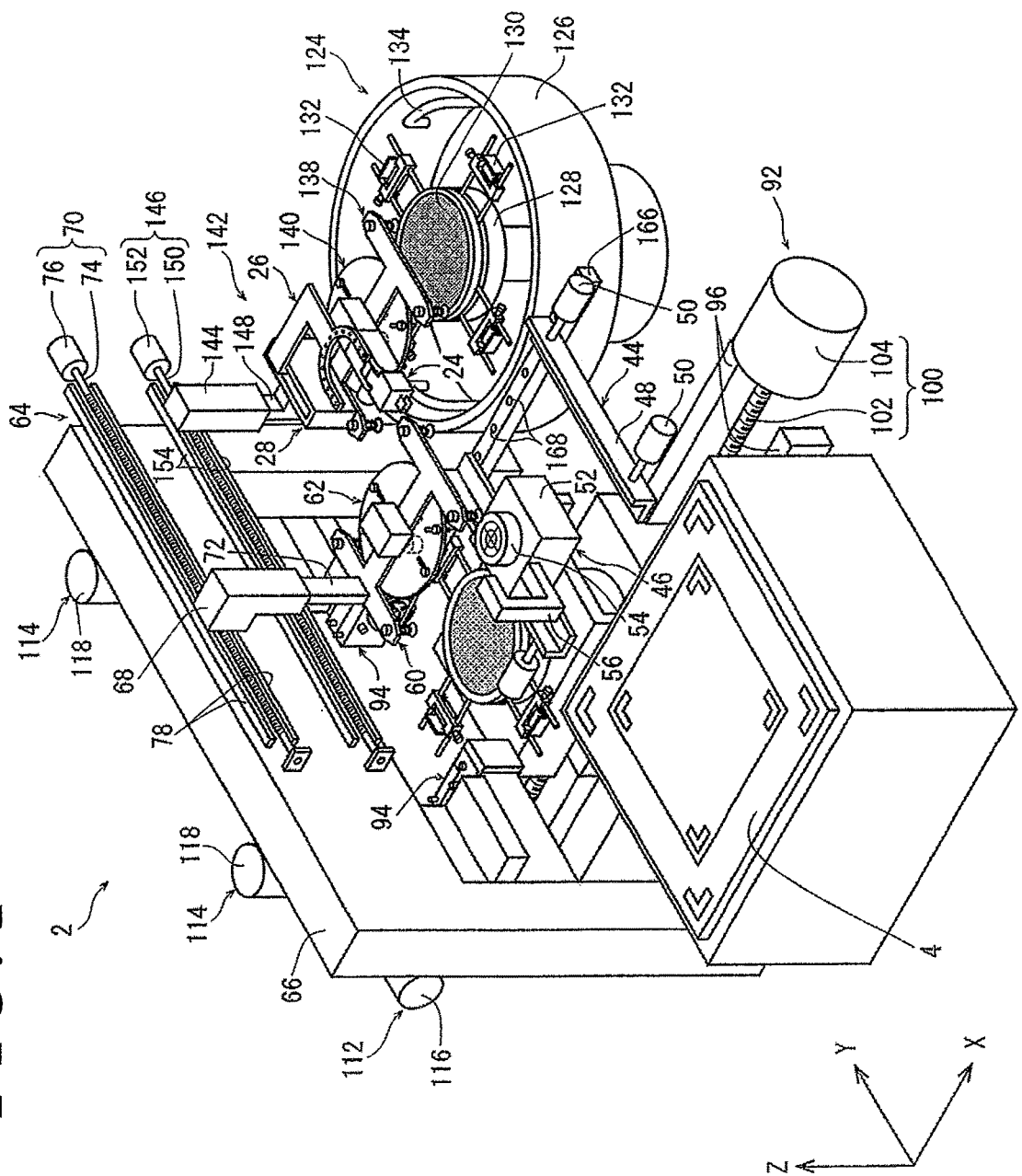
FIG. 1 is a perspective view of a cutting apparatus of an embodiment of the present invention.

A cutting apparatus of an embodiment of the present invention will be described below with reference to the drawings. As depicted in FIG. 1, the cutting apparatus entirely depicted by numeral 2 includes a rectangular cassette table 4 that can move up and down in a Z-axis direction depicted by an arrow Z in FIG. 1 and cassette table raising-lowering means (not depicted) that raises and lowers the cassette table 4 in the Z-axis direction. It suffices for the cassette table raising-lowering means to be a configuration having a ball screw that is joined to the cassette table 4 and extends in the Z-axis direction and a motor that rotates this ball screw. An X-axis direction depicted by an arrow X in FIG. 1 is a direction orthogonal to the Z-axis direction, and a Y-axis direction depicted by an arrow Y in FIG. 1 is a direction orthogonal to the X-axis direction and the Z-axis direction. Furthermore, the plane defined by the X-axis direction and the Y-axis direction is substantially horizontal.

Figure 2A:
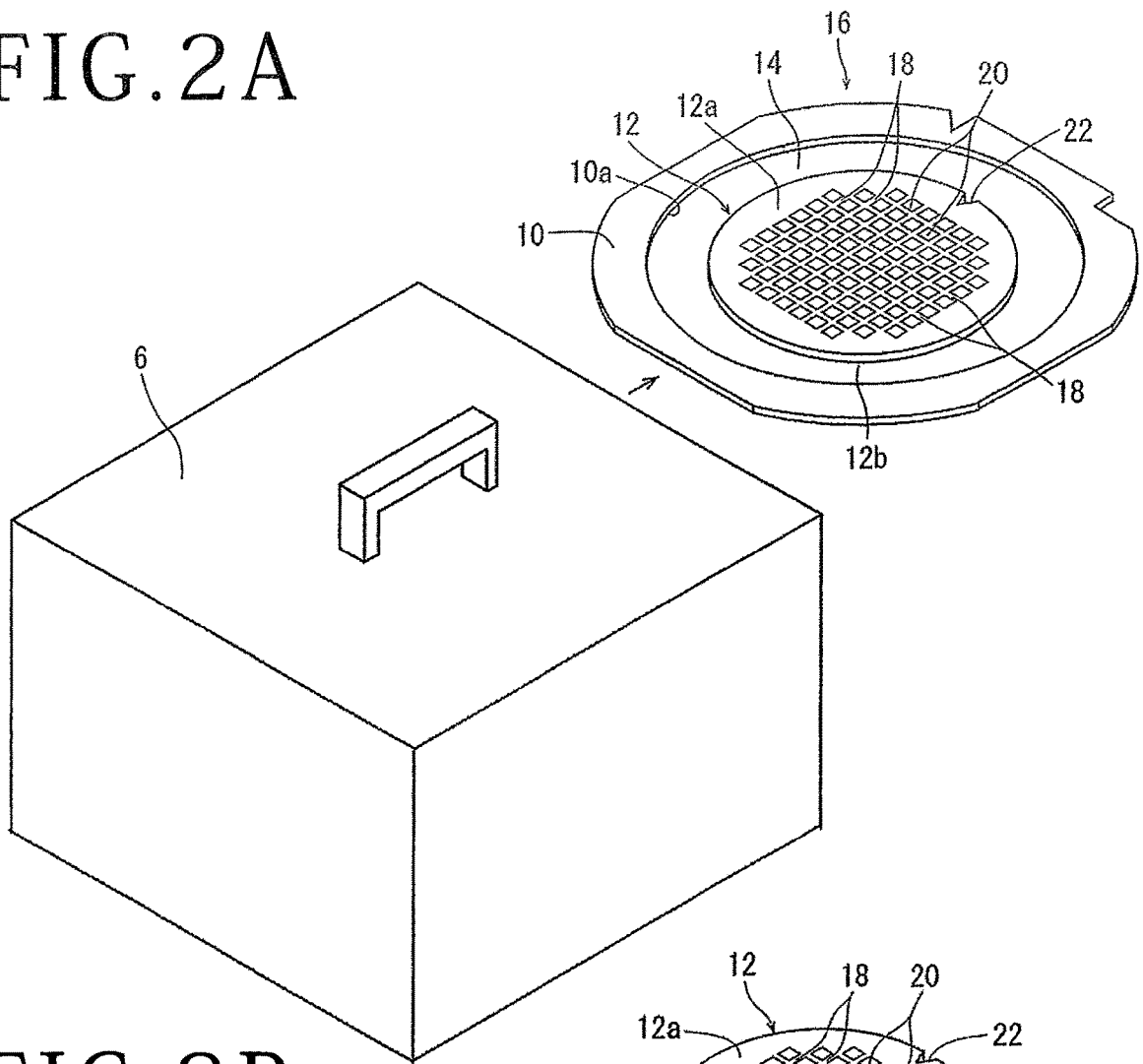
FIG. 2A is a perspective view of a first cassette selectively placed on a cassette table depicted in FIG. 1.
Figure 2B:
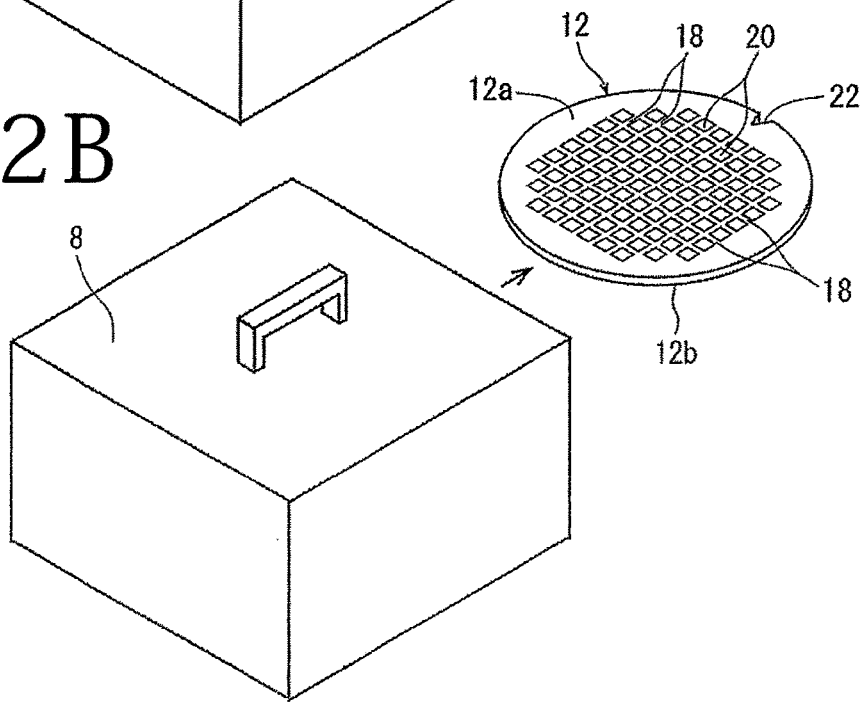
FIG. 2B is a perspective view of a second cassette.

In FIG. 2A and FIG. 2B, a first cassette 6 and a second cassette 8 selectively placed on the cassette table 4 are depicted. In the first cassette 6, plural frame units 16 in which a wafer 12 is positioned in an opening 10a of a ring-shaped frame 10 having the opening 10a and the ring-shaped frame 10 and the wafer 12 are integrated by a tape 14 are housed. In the second cassette 8 smaller than the first cassette 6, plural simple wafers 12 are housed.

In the present embodiment, as depicted in FIG. 2, the circumferential edge of the circular tape 14 having adhesiveness is fixed to the ring-shaped frame 10 and a back surface 12b of the wafer 12 with a circular disc shape is stuck to the tape 14, so that the frame unit 16 is configured. Furthermore, the wafer 12 of the frame unit 16 housed in the first cassette 6 and the simple wafer 12 housed in the second cassette 8 may be substantially the same. A front surface 12a of each wafer 12 is segmented into plural rectangular regions by planned dividing lines 18 in a lattice manner and a device 20 such as an IC or an LSI is formed in each of the plural rectangular regions. Moreover, a notch (cutout) 22 that represents the crystal orientation of the wafer 12 is formed at the circumferential edge of the wafer 12.

As depicted in FIG. 1, a cutting apparatus 2 includes a withdrawing unit 28 selectively including a clamping part 24 that clamps the ring-shaped frame 10 and withdraws it from the first cassette 6 when the first cassette 6 is placed on the cassette table 4 and a support part 26 that supports the simple wafer 12 and withdraws it from the second cassette 8 when the second cassette 8 is placed on the cassette table 4.

The withdrawing unit 28 will be described with reference to FIG. 3A and FIG. 3B. The clamping part 24 of the withdrawing unit 28 includes a support member 30, a pivot member 32 pivotally supported by the support member 30, a pivot motor 34 that causes the pivot member 32 to pivot, and a pair of clamping pieces 36 mounted on the pivot member 32. The pivot member 32 can be selectively positioned to an operation position depicted by solid lines in FIG. 3 and a non-operation position depicted by two-dot chain lines in FIG. 3 by the pivot motor 34. Furthermore, the pair of clamping pieces 36 of an air-driven system are configured in such a manner that the interval between them can be freely widened and shortened.

Figure 3A:
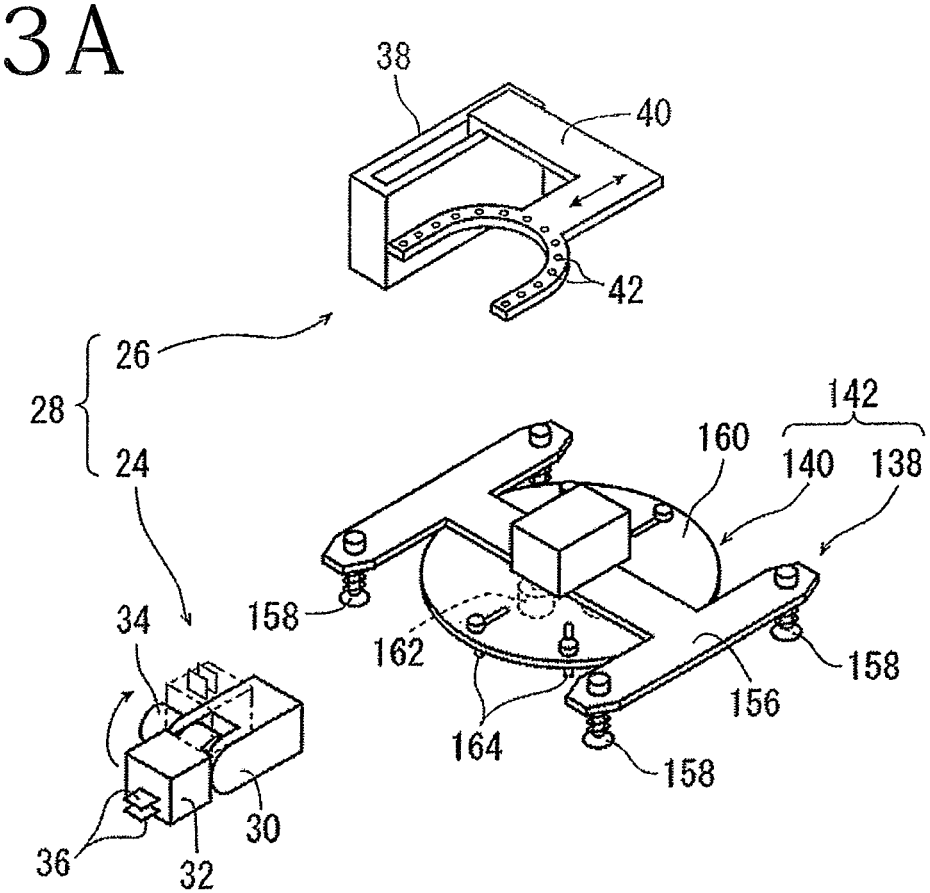
FIG. 3A is an exploded perspective view of a withdrawing unit depicted in FIG. 1.

As depicted in FIG. 3A, the support part 26 of the withdrawing unit 28 includes a casing 38 that extends in the Y-axis direction and a support piece 40 supported by the casing 38 movably in the Y-axis direction. The support piece 40 of an air-driven system is configured movably in the Y-axis direction between a non-operation position depicted in FIG. 3B and an operation position on the left side and on the front side of the plane of paper in FIG. 3B relative to the non-operation position. Furthermore, plural suction holes 42 connected to suction means (not depicted) through a flow path (not depicted) are formed in the upper surface of a U-shaped part on the tip side of the support piece 40.

Moreover, the withdrawing unit 28 of the present embodiment is moved in the Y-axis direction by a Y-axis feeding mechanism 146 (see FIG. 1) of a second conveying unit 142 to be described later and is moved in the Z-axis direction by a Z-axis feeding mechanism (not depicted) of the second conveying unit 142. In the cutting apparatus 2, a Y-axis feeding mechanism that moves the withdrawing unit 28 in the Y-axis direction and a Z-axis feeding mechanism that moves the withdrawing unit 28 in the Z-axis direction may be disposed separately from the Y-axis feeding mechanism 146 and the Z-axis feeding mechanism of the second conveying unit 142.

Furthermore, in the withdrawing unit 28, when the first cassette 6 is placed on the cassette table 4, the pivot member 32 is positioned to the operation position by the pivot motor 34 of the clamping part 24 and the support piece 40 of the support part 26 is positioned to the non-operation position. Then, after the pair of clamping pieces 36 are positioned to an end part of the ring-shaped frame 10 in the first cassette 6 by the Y-axis feeding mechanism 146 and the Z-axis feeding mechanism of the second conveying unit 142, the ring-shaped frame 10 is clamped by the pair of clamping pieces 36. Subsequently, the clamping part 24 of the withdrawing unit 28 moves the ring-shaped frame 10 clamped by the pair of clamping pieces 36 in the Y-axis direction and withdraws the ring-shaped frame 10 from the first cassette 6 by moving in the Y-axis direction by the Y-axis feeding mechanism 146 of the second conveying unit 142.

Moreover, in the withdrawing unit 28, when the second cassette 8 is placed on the cassette table 4, the support piece 40 of the support part 26 is positioned to the operation position and the pivot member 32 of the clamping part 24 is positioned to the non-operation position. Then, after the U-shaped part of the support piece 40 is positioned to the lower surface of the simple wafer 12 in the second cassette 8 by the Y-axis feeding mechanism 146 and the Z-axis feeding mechanism of the second conveying unit 142, the simple wafer 12 is sucked and supported by the support piece 40 by generating a suction force for the upper surface of the support piece 40 by the suction means. Subsequently, the support part 26 of the withdrawing unit 28 moves the simple wafer 12 sucked and supported by the support piece 40 in the Y-axis direction and withdraws the simple wafer 12 from the second cassette 8 by moving in the Y-axis direction by the Y-axis feeding mechanism 146 of the second conveying unit 142.

As depicted in FIG. 1, the cutting apparatus 2 includes a first temporary putting unit 44 on which the frame unit 16 withdrawn by the clamping part 24 of the withdrawing unit 28 is temporarily put and a second temporary putting unit 46 on which the simple wafer 12 withdrawn by the support part 26 of the withdrawing unit 28 is temporarily put.

Figure 4:
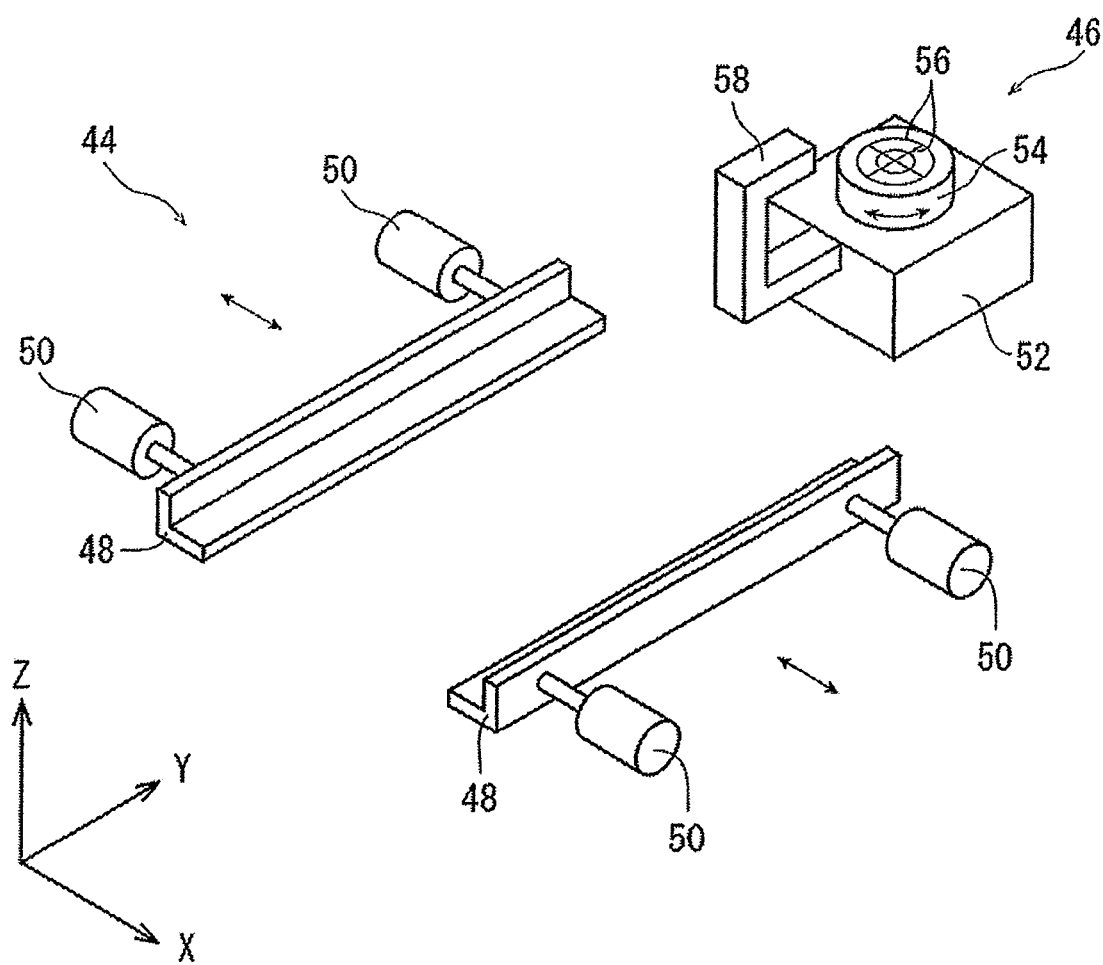
FIG. 4 is a perspective view of a first temporary putting unit and a second temporary putting unit depicted in FIG. 1.

Referring to FIG. 4, the first temporary putting unit 44 has a pair of guide rails 48 that are disposed at an interval in the X-axis direction and have an L-shape as the sectional shape and a guide rail opening-closing part 50 that changes the interval between the pair of guide rails 48 in the X-axis direction. The guide rail opening-closing part 50 includes plural air cylinders or electric cylinders joined to the pair of guide rails 48, and selectively positions the pair of guide rails 48 to a closing position at which the pair of guide rails 48 support the frame unit 16 and an opening position at which the interval between the pair of guide rails 48 in the X-axis direction is longer than at the closing position and with which the frame unit 16 is released. The pair of guide rails 48 are supported movably in the X-axis direction with the intermediary of an appropriate bracket (not depicted).

The description with reference to FIG. 4 will be continued. The second temporary putting unit 46 includes a rectangular-parallelepiped-shaped base 52 that is disposed on the upper side and on the side of the cassette table 4 in the Y-axis direction relative to the pair of guide rails 48 of the first temporary putting unit 44 and is fixed with the intermediary of an appropriate bracket (not depicted), a circular temporary putting table 54 rotatably mounted on the base 52, and a motor for the temporary putting table (not depicted) that rotates the temporary putting table 54. A suction groove 56 connected to suction means (not depicted) through a flow path (not depicted) is formed in the upper surface of the temporary putting table 54. Furthermore, in the second temporary putting unit 46, the simple wafer 12 is sucked and held by the temporary putting table 54 by generating a suction force for the upper surface of the temporary putting table 54 by the suction means. The diameter of the temporary putting table 54 is smaller than the interval between the tips of the U-shaped part of the support piece 40 of the withdrawing unit 28, which allows the lower surface of the simple wafer 12 to be brought into contact with the upper surface of the temporary putting table 54 in the state in which the lower surface side of the simple wafer 12 is sucked and supported by the support piece 40.

In the second temporary putting unit 46 of the present embodiment, a detecting part 58 that detects the crystal orientation of the simple wafer 12 is included. In this detecting part 58, a line sensor (not depicted) having light emitting element and light receiving element disposed at positions facing each other in the upward-downward direction is disposed. Furthermore, in the second temporary putting unit 46, while the temporary putting table 54 that sucks and holds the simple wafer 12 is rotated by the motor for the temporary putting table, the position of the notch 22 is detected by the line sensor of the detecting part 58 in association with the rotation angle of the temporary putting table 54. Thereby, the crystal orientation of the simple wafer 12 is detected.

As depicted in FIG. 1, the cutting apparatus 2 includes a first frame holding part 60 that holds the ring-shaped frame 10 of the frame unit 16 positioned at the first temporary putting unit 44 and conveys the frame unit 16 to a chuck table and a first wafer holding part 62 that holds the simple wafer 12 positioned at the second temporary putting unit 46 and conveys the simple wafer 12 to the chuck table.

Figure 5A:
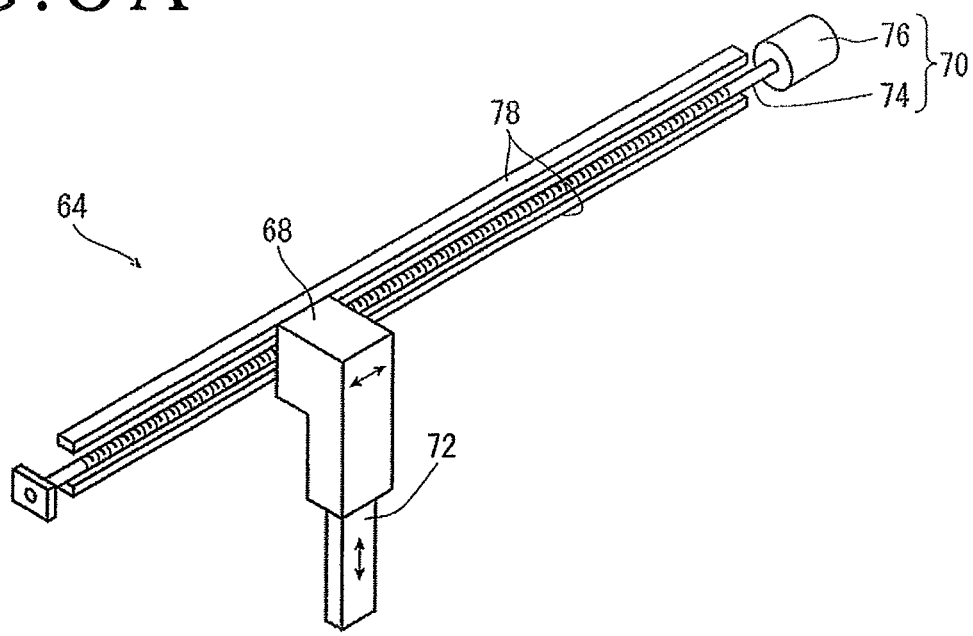
FIG. 5A is a perspective view of a first conveying unit depicted in FIG. 1.
Figure 5B:
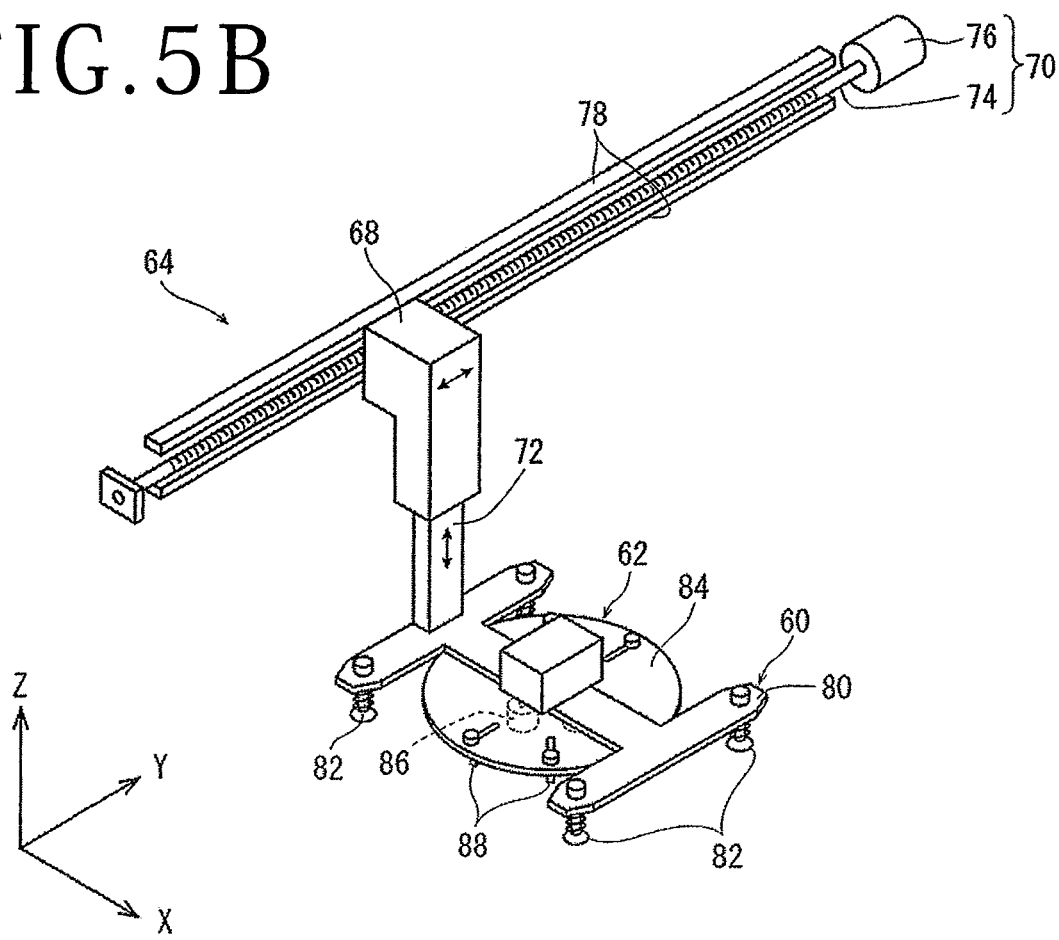
FIG. 5B is a perspective view of the state in which a first frame holding part and a first wafer holding part are mounted on the first conveying unit.

Referring to FIG. 1 and FIG. 5B, a first conveying unit 64 includes a Y-axis movable member 68 supported by a gate-shaped support annular frame 66 (see FIG. 1) movably in the Y-axis direction, a Y-axis feeding mechanism 70 that moves the Y-axis movable member 68 in the Y-axis direction, a Z-axis movable member 72 supported by the lower end of the Y-axis movable member 68 movably up and down in the Z-axis direction, and a Z-axis feeding mechanism (not depicted) that raises and lowers the Z-axis movable member 72 in the Z-axis direction.

As depicted in FIG. 5A and FIG. 5B, the Y-axis feeding mechanism 70 of the first conveying unit 64 has a ball screw 74 that extends in the Y-axis direction and a motor 76 that rotates the ball screw 74, and a nut part (not depicted) of the ball screw 74 is joined to the Y-axis movable member 68. Furthermore, the Y-axis feeding mechanism 70 converts rotational motion of the motor 76 to linear motion and transmits the linear motion to the Y-axis movable member 68 by the ball screw 74 to move the Y-axis movable member 68 in the Y-axis direction along a pair of guide rails 78 disposed on the support annular frame 66. In addition, it suffices for the Z-axis feeding mechanism of the first conveying unit 64 to be a configuration having a ball screw that is joined to the Z-axis movable member 72 and extends in the Z-axis direction and a motor that rotates this ball screw.

Figure 6A:
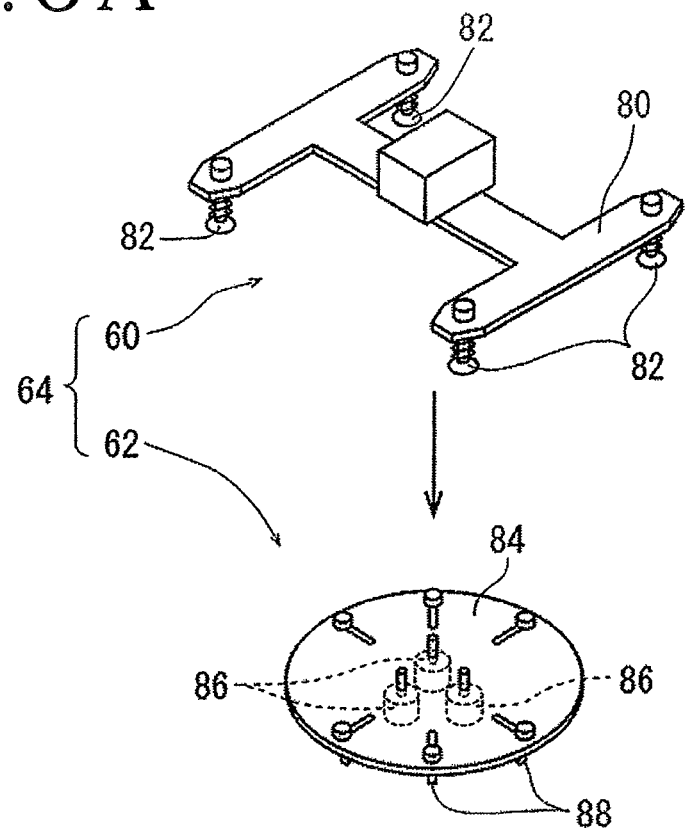
FIG. 6A is a perspective view of the first frame holding part and the first wafer holding part.
Figure 6B:
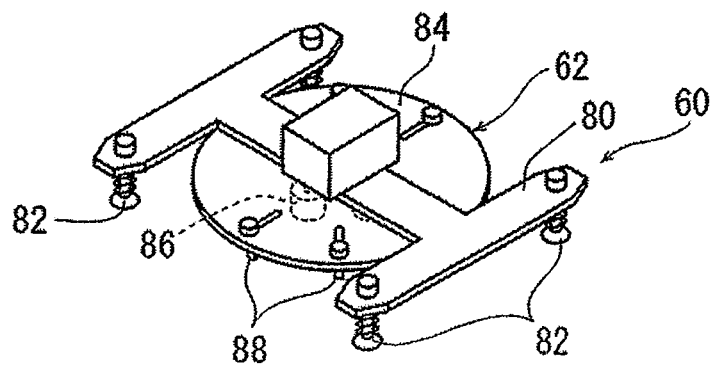
FIG. 6B is a perspective view of the first frame holding part and the first wafer holding part that are integrated.
Figure 6B:
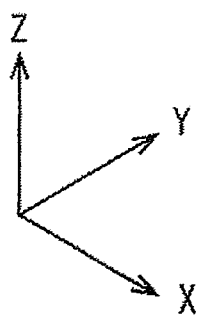

The description regarding the first conveying unit 64 will be continued with reference to FIG. 5B and FIG. 6B. As depicted in FIG. 5B, the first frame holding part 60 of the first conveying unit 64 has an H-shaped plate 80 fixed to the lower end of the Z-axis movable member 72 and plural suction pads 82 disposed on the lower surface of the plate 80, and each suction pad 82 is connected to suction means (not depicted).

Furthermore, in the first frame holding part 60, the ring-shaped frame 10 of the frame unit 16 positioned at the first temporary putting unit 44 is sucked and held by the suction pads 82 by generating a suction force for the suction pads 82 by the suction means. In addition, the first conveying unit 64 conveys the frame unit 16 sucked and held by the first frame holding part 60 from the first temporary putting unit 44 to a chuck table 90 to be described later by moving the Y-axis movable member 68 by the Y-axis feeding mechanism 70 and moving the Z-axis movable member 72 by the Z-axis feeding mechanism.

Moreover, as depicted in FIG. 5B and FIG. 6B, the first wafer holding part 62 has a circular substrate 84 connected to the lower surface of the plate 80, plural air blowing members 86 that blow air toward the lower side of the substrate 84, and plural peripheral regulating members 88 disposed at the circumferential edge part of the substrate 84. The air blowing members 86 are connected to air supply means (not depicted).

Furthermore, in the first wafer holding part 62, the air supply means connected to the air blowing members 86 is actuated, and air is blown from the air blowing members 86 toward the simple wafer 12 positioned at the second temporary putting unit 46 to generate a negative pressure at the lower ends of the air blowing members 86 based on the Bernoulli effect and suck and hold the simple wafer 12 in a contactless manner by the air blowing members 86. When the simple wafer 12 is sucked and held in a contactless manner by the first wafer holding part 62, horizontal movement of the simple wafer 12 is regulated by the plural peripheral regulating members 88. In addition, the first conveying unit 64 conveys the simple wafer 12 sucked and held by the first wafer holding part 62 from the second temporary putting unit 46 to the chuck table 90 to be described later by moving the Y-axis movable member 68 by the Y-axis feeding mechanism 70 and moving the Z-axis movable member 72 by the Z-axis feeding mechanism.

Figure 7:
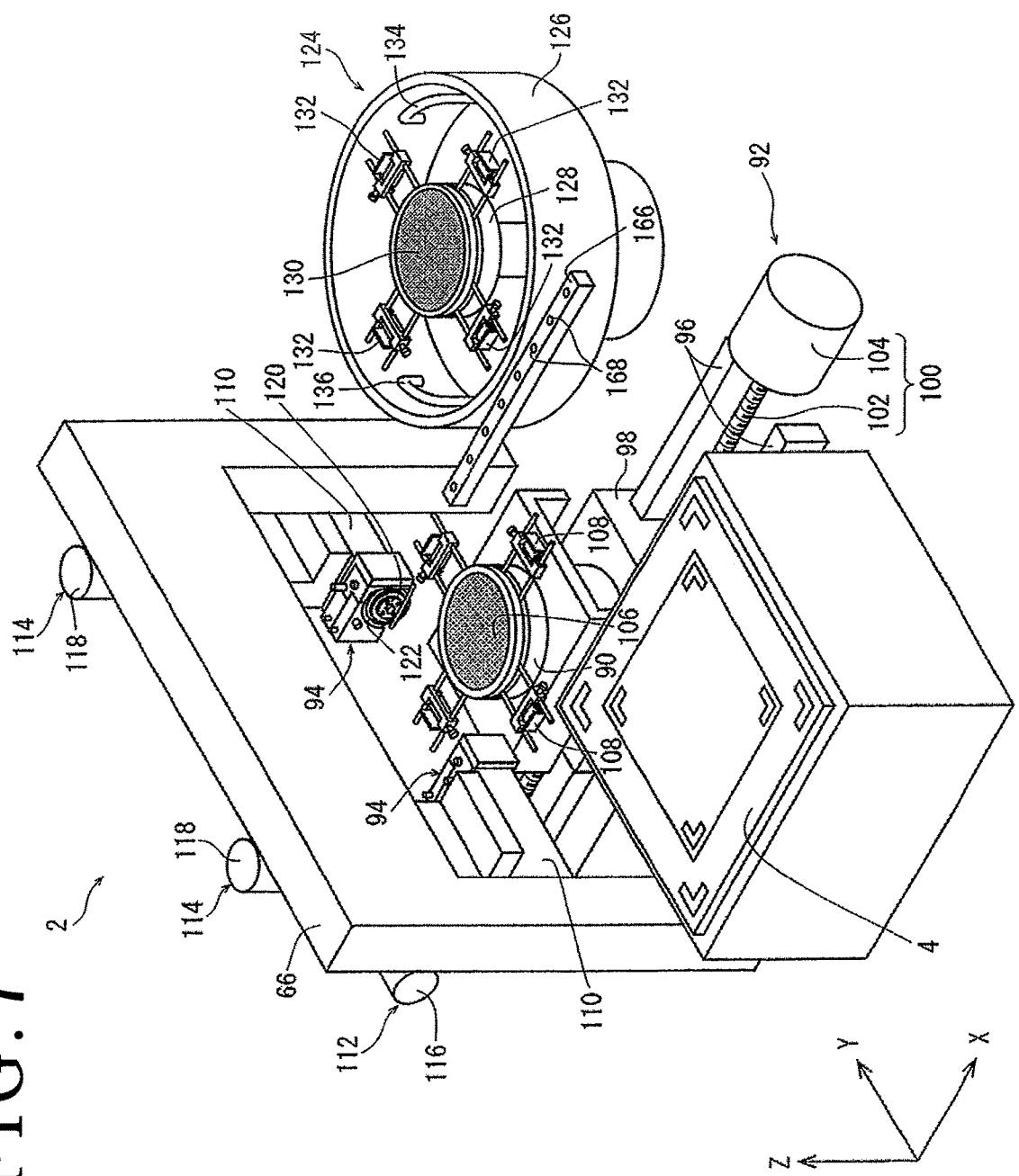
FIG. 7 is a partial perspective view of a cutting apparatus from which the first conveying unit and so forth are omitted from the cutting apparatus depicted in FIG. 1.

Referring to FIG. 7, the cutting apparatus 2 further includes a holding unit 92 including the chuck table 90 that holds the wafer 12 of the frame unit 16 or the simple wafer 12, and a cutting unit 94 that cuts the wafer 12 of the frame unit 16 or the simple wafer 12 held by the chuck table 90.

The holding unit 92 includes a pair of guide rails 96 that extend in the X-axis direction with the intermediary of an interval in the Y-axis direction, an X-axis movable member 98 mounted on the pair of guide rails 96 movably in the X-axis direction, and an X-axis feeding mechanism 100 that moves the X-axis movable member 98 in the X-axis direction. The X-axis feeding mechanism 100 has a ball screw 102 that is joined to the X-axis movable member 98 and extends in the X-axis direction, and a motor 104 that rotates the ball screw 102.

The chuck table 90 is rotatably disposed on the upper end of the X-axis movable member 98 and a motor for the chuck table (not depicted) that rotates the chuck table 90 is incorporated in the X-axis movable member 98. In the upper surface of the chuck table 90, a porous circular suction adhesion chuck 106 connected to suction means (not depicted) is disposed. Furthermore, in the chuck table 90, the wafer 12 of the frame unit 16 or the simple wafer 12 is sucked and held by the suction adhesion chuck 106 by generating a suction force for the upper surface of the suction adhesion chuck 106 by the suction means. In addition, plural clamps 108 for fixing the ring-shaped frame 10 of the frame unit 16 are annexed at the circumferential edge of the chuck table 90.

In the present embodiment, a pair of cutting units 94 are disposed on the support annular frame 66 as depicted in FIG. 7. Each cutting unit 94 includes a spindle housing 110 supported by the support annular frame 66 movably in the Y-axis direction and the Z-axis direction, a Y-axis feeding mechanism 112 (only one is depicted) that moves the spindle housing 110 in the Y-axis direction, and a Z-axis feeding mechanism 114 that moves the spindle housing 110 in the Z-axis direction. The Y-axis feeding mechanism 112 has a ball screw (not depicted) that is joined to the spindle housing 110 and extends in the Y-axis direction and a motor 116 that rotates this ball screw. The Z-axis feeding mechanism 114 has a ball screw (not depicted) that is joined to the spindle housing 110 and extends in the Z-axis direction and a motor 118 that rotates this ball screw.

The description regarding the cutting unit 94 will be continued with reference to FIG. 7. In the spindle housing 110, a spindle 120 is supported rotatably around an axis line that extends in the Y-axis direction and a motor for the spindle (not depicted) that rotates the spindle 120 is disposed. In addition, a ring-shaped cutting blade 122 is fixed to the tip of the spindle 120.

Furthermore, in the cutting unit 94, while the cutting blade 122 is rotated together with the spindle 120 at high speed by the motor for the spindle, the spindle housing 110 is lowered by the Z-axis feeding mechanism 114 and the cutting blade 122 rotated at high speed is caused to cut into the wafer 12 of the frame unit 16 or the simple wafer 12 held by the chuck table 90. In addition, processing feed of the chuck table 90 is carried out in the X-axis direction at a predetermined processing feed speed by the X-axis feeding mechanism 100. Thereby, the wafer 12 of the frame unit 16 or the simple wafer 12 is cut.

The description with reference to FIG. 7 will be further continued. The cutting apparatus 2 includes a cleaning unit 124 that holds and cleans the wafer 12 of the frame unit 16 or the simple wafer 12 that has been cut.

The cleaning unit 124 includes a casing 126 with a circular cylindrical shape, a spinner table 128 disposed inside the casing 126 rotatably and movably up and down in the Z-axis direction, a motor for the spinner table (not depicted) that rotates the spinner table 128, and spinner table raising-lowering means (not depicted) that raises and lowers the spinner table 128 in the Z-axis direction between an upper putting-removing position for putting and removing the wafer 12 and a lower cleaning position for cleaning the wafer 12. It suffices for the spinner table raising-lowering means to be a configuration having an air cylinder or electric cylinder.

In the upper surface of the spinner table 128, a porous circular suction adhesion chuck 130 connected to suction means (not depicted) is disposed. Furthermore, in the spinner table 128, the wafer 12 of the frame unit 16 or the simple wafer 12 is sucked and held by the suction adhesion chuck 130 by generating a suction force for the upper surface of the suction adhesion chuck 130 by the suction means. In addition, plural clamps 132 for fixing the ring-shaped frame 10 of the frame unit 16 are annexed at the circumferential edge of the spinner table 128.

Moreover, as depicted in FIG. 7, the cleaning unit 124 includes a cleaning water nozzle 134 that injects cleaning water onto the upper surface of the wafer 12 of the frame unit 16 or the simple wafer 12 held by the spinner table 128, and an air nozzle 136 that injects drying air onto the upper surface of the wafer 12 of the frame unit 16 or the simple wafer 12 held by the spinner table 128. Each of the cleaning water nozzle 134 and the air nozzle 136 is selectively positioned to an operation position located above the spinner table 128 positioned at the lower cleaning position and a non-operation position that is separate from the upper side of the spinner table 128 and is depicted in FIG. 7.

Furthermore, in the cleaning unit 124, the spinner table 128 that holds the wafer 12 of the frame unit 16 or the simple wafer 12 is lowered from the upper putting-removing position to the lower cleaning position by the spinner table raising-lowering means. In addition, the cleaning water nozzle 134 is positioned to the operation position. Thereafter, while the spinner table 128 is rotated by the motor for the spinner table, the cleaning water is injected from the cleaning water nozzle 134 toward the wafer 12 of the frame unit 16 or the simple wafer 12 held by the spinner table 128. This can clean the wafer 12 of the frame unit 16 or the simple wafer 12 and remove the cleaning water from the upper surface of the frame unit 16 or the simple wafer 12 by a centrifugal force due to the rotation of the spinner table 128.

Moreover, in the cleaning unit 124, after the cleaning water nozzle 134 is positioned to the non-operation position and the air nozzle 136 is positioned to the operation position, the drying air is injected from the air nozzle 136 toward the frame unit 16 or the simple wafer 12 held by the spinner table 128. This can remove the cleaning water that has not been completely removed by the centrifugal force due to the rotation of the spinner table 128 from the upper surface of the frame unit 16 or the simple wafer 12 and dry the upper surface of the frame unit 16 or the simple wafer 12.

As depicted in FIG. 1, the cutting apparatus 2 includes the second conveying unit 142 including a second frame holding part 138 that holds the ring-shaped frame 10 of the frame unit 16 of the cut wafer 12 and conveys the frame unit 16 from the chuck table 90 to the cleaning unit 124 and a second wafer holding part 140 that holds the cut simple wafer 12 and conveys the simple wafer 12 from the chuck table 90 to the cleaning unit 124.

Referring to FIG. 1 and FIG. 8A, the second conveying unit 142 includes a Y-axis movable member 144 supported by the gate-shaped support annular frame 66 (see FIG. 1) movably in the Y-axis direction, a Y-axis feeding mechanism 146 that moves the Y-axis movable member 144 in the Y-axis direction, a Z-axis movable member 148 supported by the lower end of the Y-axis movable member 144 movably up and down in the Z-axis direction, and a Z-axis feeding mechanism (not depicted) that raises and lowers the Z-axis movable member 148 in the Z-axis direction.

As depicted in FIG. 8A, the Y-axis feeding mechanism 146 of the second conveying unit 142 has a ball screw 150 that extends in the Y-axis direction and a motor 152 that rotates the ball screw 150, and a nut part (not depicted) of the ball screw 150 is joined to the Y-axis movable member 144. Furthermore, the Y-axis feeding mechanism 146 converts rotational motion of the motor 152 to linear motion and transmits the linear motion to the Y-axis movable member 144 by the ball screw 150 to move the Y-axis movable member 144 in the Y-axis direction along a pair of guide rails 154 disposed on the support annular frame 66. In addition, it suffices for the Z-axis feeding mechanism of the second conveying unit 142 to be a configuration having a ball screw that is joined to the Z-axis movable member 148 and extends in the Z-axis direction and a motor that rotates this ball screw.

Figure 3B:
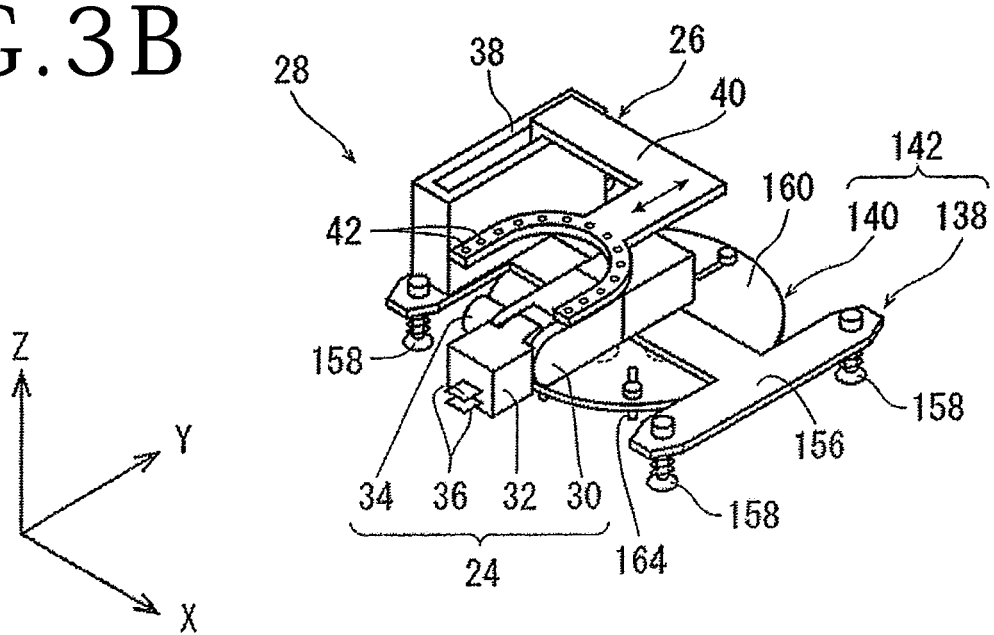
FIG. 3B is a perspective view of the withdrawing unit.

The description regarding the second conveying unit 142 will be continued with reference to FIG. 3B and FIG. 8B. The second frame holding part 138 of the second conveying unit 142 has an H-shaped plate 156 fixed to the lower end of the Z-axis movable member 148 and plural suction pads 158 disposed on the lower surface of the plate 156, and each suction pad 158 is connected to suction means (not depicted).

Furthermore, in the second frame holding part 138, the ring-shaped frame 10 of the frame unit 16 of the cut wafer 12 is sucked and held by the suction pads 158 by generating a suction force for the suction pads 158 by the suction means. In addition, the second conveying unit 142 conveys the frame unit 16 sucked and held by the second frame holding part 138 from the chuck table 90 to the cleaning unit 124 by moving the Y-axis movable member 144 by the Y-axis feeding mechanism 146 and moving the Z-axis movable member 148 by the Z-axis feeding mechanism.

Moreover, as depicted in FIG. 3A and FIG. 8B, the second wafer holding part 140 has a circular substrate 160 connected to the lower surface of the plate 156, plural air blowing members 162 that blow air toward the lower side of the substrate 160, and plural peripheral regulating members 164 disposed at the circumferential edge part of the substrate 160. The air blowing members 162 are connected to air supply means (not depicted).

Furthermore, in the second wafer holding part 140, the air supply means connected to the air blowing members 162 is actuated, and air is blown from the air blowing members 162 toward the cut simple wafer 12 to generate a negative pressure at the lower ends of the air blowing members 162 based on the Bernoulli effect and suck and hold the simple wafer 12 in a contactless manner by the air blowing members 162. When the simple wafer 12 is sucked and held in a contactless manner by the second wafer holding part 140, horizontal movement of the simple wafer 12 is regulated by the plural peripheral regulating members 164. In addition, the second conveying unit 142 conveys the simple wafer 12 sucked and held by the second wafer holding part 140 from the chuck table 90 to the cleaning unit 124 by moving the Y-axis movable member 144 by the Y-axis feeding mechanism 146 and moving the Z-axis movable member 148 by the Z-axis feeding mechanism.

As is understood through reference to FIG. 3B and FIG. 8B, the second conveying unit 142 of the present embodiment has the above-described withdrawing unit 28, and the clamping part 24 and the support part 26 of the withdrawing unit 28 are disposed over the upper surface of the H-shaped plate 156 of the second frame holding part 138 of the second conveying unit 142.

In the present embodiment, as depicted in FIG. 7, the cutting apparatus 2 includes a lower-surface air blow member 166 that injects drying air onto the lower surface of the frame unit 16 or the simple wafer 12 cleaned by the cleaning unit 124. The lower-surface air blow member 166 is disposed adjacent to the casing 126 of the cleaning unit 124 and is fixed with the intermediary of an appropriate bracket (not depicted). In the upper surface of the lower-surface air blow member 166 that extends along the X-axis direction and has a hollow shape, plural injection ports 168 are formed at intervals in the X-axis direction.

Furthermore, in the lower-surface air blow member 166, when the cleaned frame unit 16 or simple wafer 12 is being conveyed from the cleaning unit 124, the cleaning water can be removed from the lower surface of the frame unit 16 or the simple wafer 12 and the lower surface can be dried by injecting the drying air from the injection ports 168 toward the lower surface of the frame unit 16 or the simple wafer 12.

Next, a method for cutting the wafer 12 by using the above-described cutting apparatus 2 will be described. In the cutting apparatus 2, cutting processing can be carried out for both the wafer 12 of the frame unit 16 and the simple wafer 12. First, a method for cutting the wafer 12 of the frame unit 16 will be described and thereafter a method for cutting the simple wafer 12 will be described.

When the wafer 12 of the frame unit 16 is cut by using the cutting apparatus 2, first, a cassette placement step of placing, on the cassette table 4, the first cassette 6 in which the frame unit 16, in which the wafer 12 is positioned in the opening 10a of the ring-shaped frame 10 having the opening 10a and the ring-shaped frame 10 and the wafer 12 are integrated by the tape 14, is housed is carried out. In the first cassette 6, plural wafers 12 are housed in the state in which the front surfaces 12a of the wafers 12 are oriented upward.

After the cassette placement step is carried out, a ring-shaped frame withdrawal step of clamping the ring-shaped frame 10 in the first cassette 6 placed on the cassette table 4 by the clamping part 24 of the withdrawing unit 28 and withdrawing the frame unit 16 from the first cassette 6 is carried out.

In the ring-shaped frame withdrawal step, first, the pivot member 32 of the clamping part 24 of the withdrawing unit 28 is positioned to the operation position and the support piece 40 of the support part 26 is positioned to the non-operation position.

Subsequently, the Y-axis feeding mechanism 146 and the Z-axis feeding mechanism of the second conveying unit 142 are actuated and the pair of clamping pieces 36 are positioned to an end part of the ring-shaped frame 10 of the arbitrary frame unit 16 in the first cassette 6. Then, after the end part of the ring-shaped frame 10 is clamped by the pair of clamping pieces 36, the clamping part 24 is moved in the Y-axis direction by the Y-axis feeding mechanism 146 of the second conveying unit 142 and the frame unit 16 is withdrawn from the first cassette 6.

After the ring-shaped frame withdrawal step is carried out, a temporary putting step of temporarily putting the frame unit 16 withdrawn from the first cassette 6 by the clamping part 24 of the withdrawing unit 28 on the first temporary putting unit 44 is carried out.

In the temporary putting step, first, the Y-axis feeding mechanism 146 and the Z-axis feeding mechanism of the second conveying unit 142 are actuated and the lower surface of the frame unit 16 withdrawn from the first cassette 6 by the clamping part 24 of the withdrawing unit 28 is brought into contact with the upper surfaces of the pair of guide rails 48. At this time, the pair of guide rails 48 of the first temporary putting unit 44 are positioned at the closing position at which they support the frame unit 16 by the guide rail opening-closing part 50. Then, the clamping of the ring-shaped frame 10 by the pair of clamping pieces 36 is released and the frame unit 16 is temporarily put on the pair of guide rails 48.

After the temporary putting step is carried out, a first ring-shaped frame conveyance step of holding the ring-shaped frame 10 of the frame unit 16 positioned at the first temporary putting unit 44 by the first frame holding part 60 of the first conveying unit 64 and conveying the frame unit 16 to the chuck table 90 is carried out.

In the first ring-shaped frame conveyance step, first, the Y-axis feeding mechanism 70 and the Z-axis feeding mechanism of the first conveying unit 64 are actuated and the first frame holding part 60 is positioned above the frame unit 16 positioned at the first temporary putting unit 44. In addition, the Y-axis feeding mechanism 146 and the Z-axis feeding mechanism of the second conveying unit 142 are actuated as appropriate and the clamping part 24 of the withdrawing unit 28 that has temporarily put the frame unit 16 on the first temporary putting unit 44 in the temporary putting step is moved to such a position as not to hinder the first ring-shaped frame conveyance step.

Subsequently, the first frame holding part 60 is lowered by the Z-axis feeding mechanism of the first conveying unit 64 and the suction pads 82 are brought into tight contact with the ring-shaped frame 10 of the frame unit 16. Next, a suction force is generated for the suction pads 82 by the suction means and the ring-shaped frame 10 is sucked and held by the suction pads 82. Subsequently, the pair of guide rails 48 of the first temporary putting unit 44 are positioned to the opening position with which the frame unit 16 is released by the guide rail opening-closing part 50. With the opening position of the pair of guide rails 48, the first frame holding part 60 that holds the frame unit 16 can pass between the pair of guide rails 48.

Subsequently, the first frame holding part 60 is lowered by the Z-axis feeding mechanism of the first conveying unit 64 and the lower surface of the frame unit 16 sucked and held by the suction pads 82 is brought into contact with the upper surface of the chuck table 90 positioned directly under the first temporary putting unit 44 by the X-axis feeding mechanism 100. Next, the suction force of the suction pads 82 is deactivated to transfer the frame unit 16 to the chuck table 90. In this manner, the frame unit 16 is conveyed from the first temporary putting unit 44 to the chuck table 90.

After the first ring-shaped frame conveyance step is carried out, a cutting step of cutting the wafer 12 of the frame unit 16 held by the chuck table 90 is carried out. In the cutting step, first, the wafer 12 of the frame unit 16 is sucked and held by the upper surface of the chuck table 90 and the ring-shaped frame 10 is fixed by the plural clamps 108. Subsequently, the wafer 12 of the frame unit 16 is imaged by imaging means (not depicted) and the planned dividing lines 18 of the wafer 12 are aligned with the X-axis direction based on an image of the wafer 12 imaged by the imaging means. In addition, the cutting blade 122 of each of the pair of cutting units 94 is positioned above the planned dividing line 18 aligned with the X-axis direction. Next, each cutting blade 122 is rotated together with each spindle 120 by each motor for the spindle.

Subsequently, the spindle housings 110 are lowered by the Z-axis feeding mechanisms 114 and the cutting edge of each cutting blade 122 is caused to cut into the planned dividing line 18 aligned with the X-axis direction until reaching the back surface 12b from the front surface 12a of the wafer 12. In addition, processing feed of the chuck table 90 is carried out in the X-axis direction relative to the cutting units 94 and cutting is carried out along the planned dividing lines 18 to carry out complete cutting processing of completely cutting the wafer 12.

Subsequently, the complete cutting processing is repeated while indexing feed of each cutting unit 94 is carried out in the Y-axis direction relative to the chuck table 90 by the interval of the planned dividing lines 18 in the Y-axis direction, and all of the planned dividing lines 18 aligned with the X-axis direction are completely cut. Next, after the chuck table 90 is rotated by 90 degrees, the complete cutting processing is repeated while indexing feed is carried out, and all of the planned dividing lines 18 orthogonal to the planned dividing lines 18 for which the complete cutting processing has been carried out previously are completely cut. In this manner, the wafer 12 of the frame unit 16 held by the chuck table 90 is divided into device chips of each individual device 20. In the cutting step for the wafer 12 of the frame unit 16, the tape 14 is not completely cut although the wafer 12 is completely cut, and the state in which the wafer 12 divided into the respective device chips is supported by the ring-shaped frame 10 with the intermediary of the tape 14 is kept.

After the cutting step is carried out, a second ring-shaped frame conveyance step of holding the ring-shaped frame 10 of the frame unit 16 of the cut wafer 12 by the second frame holding part 138 of the second conveying unit 142 and conveying the frame unit 16 from the chuck table 90 to the cleaning unit 124 is carried out.

In the second ring-shaped frame conveyance step, first, the chuck table 90 is positioned directly under the first temporary putting unit 44 by the X-axis feeding mechanism 100. Subsequently, the suction force of the chuck table 90 is deactivated and the fixing of the ring-shaped frame 10 by the plural clamps 108 is released. Furthermore, the Y-axis feeding mechanism 70 and the Z-axis feeding mechanism of the first conveying unit 64 are actuated as appropriate and the first frame holding part 60 that has conveyed the frame unit 16 in the first ring-shaped frame conveyance step is moved to such a position as not to hinder the second ring-shaped frame conveyance step.

Subsequently, the Y-axis feeding mechanism 146 of the second conveying unit 142 is actuated and the second frame holding part 138 is positioned above the frame unit 16 placed on the chuck table 90. Next, the pair of guide rails 48 of the first temporary putting unit 44 are positioned to the opening position and the second frame holding part 138 is lowered by the Z-axis feeding mechanism of the second conveying unit 142 to bring the suction pads 158 into tight contact with the ring-shaped frame 10 of the frame unit 16. In addition, the ring-shaped frame 10 is sucked and held by the suction pads 158.

Subsequently, the second frame holding part 138 is raised by the Z-axis feeding mechanism of the second conveying unit 142. Thereafter, the Y-axis feeding mechanism 146 of the second conveying unit 142 is actuated and the ring-shaped frame 10 sucked and held by the suction pads 158 is positioned above the spinner table 128 of the cleaning unit 124. Next, the second frame holding part 138 is lowered by the Z-axis feeding mechanism of the second conveying unit 142 and the lower surface of the frame unit 16 sucked and held by the suction pads 158 is brought into contact with the upper surface of the spinner table 128 positioned at the upper putting-removing position. Subsequently, the suction force of the suction pads 158 is deactivated to transfer the frame unit 16 to the spinner table 128. In this manner, the frame unit 16 of the cut wafer 12 is conveyed from the chuck table 90 to the cleaning unit 124.

After the second ring-shaped frame conveyance step is carried out, a cleaning step of holding the cut wafer 12 of the frame unit 16 by the cleaning unit 124 and cleaning the wafer 12 is carried out. In the cleaning step, first, the wafer 12 of the frame unit 16 is sucked and held by the upper surface of the spinner table 128 and the ring-shaped frame 10 is fixed by the plural clamps 132. Subsequently, the spinner table 128 is lowered from the upper putting-removing position to the lower cleaning position by the spinner table raising-lowering means. Next, after the cleaning water nozzle 134 is positioned from the non-operation position to the operation position, the cleaning water is injected from the cleaning water nozzle 134 toward the cut wafer 12 of the frame unit 16 while the spinner table 128 is rotated by the motor for the spinner table. Thereby, the wafer 12 of the frame unit 16 can be cleaned and cutting dust can be removed. In addition, the cleaning water can be removed from the upper surface of the frame unit 16 by a centrifugal force due to the rotation of the spinner table 128.

Subsequently, the cleaning water nozzle 134 is positioned from the operation position to the non-operation position and the air nozzle 136 is positioned from the non-operation position to the operation position. Then, the drying air is injected from the air nozzle 136 toward the frame unit 16. This can remove the cleaning water that has not been completely removed by the centrifugal force due to the rotation of the spinner table 128 from the upper surface of the frame unit 16 and dry the upper surface of the frame unit 16. Thereafter, the air nozzle 136 is positioned from the operation position to the non-operation position and the spinner table 128 is positioned from the lower cleaning position to the upper putting-removing position. Then, the suction force of the spinner table 128 is deactivated and the fixing of the ring-shaped frame 10 by the plural clamps 132 is released.

After the cleaning step is carried out, a third ring-shaped frame conveyance step of holding the ring-shaped frame 10 of the frame unit 16 cleaned by the cleaning unit 124 by the first frame holding part 60 of the first conveying unit 64 and conveying the frame unit 16 from the cleaning unit 124 to the first temporary putting unit 44 is carried out.

In the third ring-shaped frame conveyance step, first, the Y-axis feeding mechanism 70 of the first conveying unit 64 is actuated and the first frame holding part 60 is positioned above the frame unit 16 placed on the spinner table 128. Furthermore, the Y-axis feeding mechanism 146 and the Z-axis feeding mechanism of the second conveying unit 142 are actuated as appropriate and the second frame holding part 138 that has conveyed the frame unit 16 in the second ring-shaped frame conveyance step is moved to such a position as not to hinder the third ring-shaped frame conveyance step.

Subsequently, the first frame holding part 60 is lowered by the Z-axis feeding mechanism of the first conveying unit 64 and the suction pads 82 are brought into tight contact with the ring-shaped frame 10 of the frame unit 16. In addition, the ring-shaped frame 10 is sucked and held by the suction pads 82. Next, the first frame holding part 60 is raised by the Z-axis feeding mechanism of the first conveying unit 64 and the frame unit 16 sucked and held by the suction pads 82 is separated upward from the spinner table 128.

Subsequently, the Y-axis feeding mechanism 70 of the first conveying unit 64 is actuated and the frame unit 16 sucked and held by the suction pads 82 of the first frame holding part 60 is caused to pass above the lower-surface air blow member 166. At this time, the drying air is injected from the injection ports 168 of the air blow member 166 toward the lower surface of the frame unit 16. This can remove the cleaning water from the lower surface of the frame unit 16 and dry the lower surface of the frame unit 16.

Moreover, the Y-axis feeding mechanism 70 of the first conveying unit 64 is actuated and the frame unit 16 sucked and held by the suction pads 82 is positioned above the first temporary putting unit 44. Subsequently, the pair of guide rails 48 are positioned from the opening position to the closing position by the guide rail opening-closing part 50. Subsequently, the first frame holding part 60 is lowered by the Z-axis feeding mechanism of the first conveying unit 64 and the lower surface of the frame unit 16 sucked and held by the suction pads 82 is brought into contact with the upper surfaces of the pair of guide rails 48. Next, the suction force of the suction pads 82 is deactivated to transfer the frame unit 16 to the pair of guide rails 48. In this manner, the frame unit 16 cleaned by the cleaning unit 124 is conveyed from the cleaning unit 124 to the first temporary putting unit 44.

After the third ring-shaped frame conveyance step is carried out, a fourth ring-shaped frame conveyance step of clamping the ring-shaped frame 10 of the frame unit 16 positioned at the first temporary putting unit 44 by the clamping part 24 of the withdrawing unit 28 and conveying the frame unit 16 from the first temporary putting unit 44 to the first cassette 6 to house it is carried out.

In the fourth ring-shaped frame conveyance step, first, in the state in which the pivot member 32 of the clamping part 24 is positioned at the operation position and the support piece 40 of the support part 26 is positioned at the non-operation position, the Y-axis feeding mechanism 146 and the Z-axis feeding mechanism of the second conveying unit 142 are actuated and the pair of clamping pieces 36 are positioned to an end part (end part in the Y-axis direction on the side remoter from the cassette table 4) of the ring-shaped frame 10 of the frame unit 16 positioned at the first temporary putting unit 44. Furthermore, the Y-axis feeding mechanism 70 and the Z-axis feeding mechanism of the first conveying unit 64 are actuated as appropriate and the first frame holding part 60 that has conveyed the frame unit 16 in the third ring-shaped frame conveyance step is moved to such a position as not to hinder the fourth ring-shaped frame conveyance step.

Subsequently, after the end part of the ring-shaped frame 10 is clamped by the pair of clamping pieces 36, the frame unit 16 is moved in the Y-axis direction and the Z-axis direction by the Y-axis feeding mechanism 146 and the Z-axis feeding mechanism of the second conveying unit 142 to convey the frame unit 16 from the first temporary putting unit 44 to the first cassette 6 and house it. Then, the clamping of the ring-shaped frame 10 by the pair of clamping pieces 36 is released and the first cassette 6 is caused to support the frame unit 16.

The method for cutting the wafer 12 of the frame unit 16 by using the cutting apparatus 2 is as described above. Next, a method for cutting the simple wafer 12 by using the cutting apparatus 2 will be described.

When the simple wafer 12 is cut by using the cutting apparatus 2, first, a cassette placement step of placing the second cassette 8 in which the simple wafer 12 is housed on the cassette table 4 is carried out. In the second cassette 8, plural wafers 12 are housed in the state in which the front surfaces 12a of the simple wafers 12 are oriented upward.

After the cassette placement step is carried out, a wafer withdrawal step of supporting the simple wafer 12 in the second cassette 8 placed on the cassette table 4 by the support part 26 of the withdrawing unit 28 and withdrawing the simple wafer 12 from the second cassette 8 is carried out.

In the wafer withdrawal step, first, the support piece 40 of the support part 26 of the withdrawing unit 28 is positioned to the operation position and the pivot member 32 of the clamping part 24 is positioned to the non-operation position. Subsequently, the Y-axis feeding mechanism 146 and the Z-axis feeding mechanism of the second conveying unit 142 are actuated and the support piece 40 is inserted under the arbitrary wafer 12 in the second cassette 8. Next, the support piece 40 is slightly raised and the upper surface of the support piece 40 is brought into tight contact with the lower surface (back surface 12b) of the wafer 12. In addition, the wafer 12 is sucked and supported by the upper surface of the support piece 40. Then, the support piece 40 is moved in the Y-axis direction by the Y-axis feeding mechanism 146 of the second conveying unit 142 and the simple wafer 12 is withdrawn from the second cassette 8.

After the wafer withdrawal step is carried out, a temporary putting step of temporarily putting the simple wafer 12 withdrawn from the second cassette 8 by the support part 26 of the withdrawing unit 28 on the second temporary putting unit 46 is carried out.

In the temporary putting step, first, the Y-axis feeding mechanism 146 and the Z-axis feeding mechanism of the second conveying unit 142 are actuated and the lower surface of the simple wafer 12 withdrawn from the second cassette 8 by the support part 26 of the withdrawing unit 28 is brought into contact with the upper surface of the temporary putting table 54 of the second temporary putting unit 46. Then, the simple wafer 12 is sucked and held by the upper surface of the temporary putting table 54 and the suction force of the support piece 40 of the withdrawing unit 28 is deactivated to temporarily put the simple wafer 12 on the second temporary putting unit 46.

After the temporary putting step is carried out, a crystal orientation detection step of detecting the crystal orientation of the simple wafer 12 that has been withdrawn from the second cassette 8 by the support part 26 of the withdrawing unit 28 and been positioned at the second temporary putting unit 46 is carried out.

In the crystal orientation detection step, while the temporary putting table 54 that sucks and holds the simple wafer 12 is rotated by the motor for the temporary putting table, the position of the notch 22 is detected by the line sensor of the detecting part 58 in association with the rotation angle of the temporary putting table 54. Thereby, the crystal orientation of the simple wafer 12 is detected. Alternatively, the detecting part 58 may include imaging means such as a charge-coupled device (CCD) and the crystal orientation of the simple wafer 12 may be detected by imaging the simple wafer 12 sucked and held by the temporary putting table 54 by the imaging means of the detecting part 58 and detecting the position of the notch 22.

After the crystal orientation detection step is carried out, a first wafer conveyance step of holding the simple wafer 12 positioned at the second temporary putting unit 46 and conveying the simple wafer 12 to the chuck table 90 is carried out.

In the first wafer conveyance step of the present embodiment, first, the Y-axis feeding mechanism 146 and the Z-axis feeding mechanism of the second conveying unit 142 are actuated and the upper surface of the support piece 40 of the support part 26 of the withdrawing unit 28 is brought into tight contact with the lower surface of the simple wafer 12 sucked and held by the temporary putting table 54 of the second temporary putting unit 46. Subsequently, the simple wafer 12 is sucked and supported by the upper surface of the support piece 40 of the support part 26 again and the suction force of the temporary putting table 54 is deactivated. Next, the Y-axis feeding mechanism 146 and the Z-axis feeding mechanism of the second conveying unit 142 are actuated and the simple wafer 12 sucked and supported by the support piece 40 is separated from the second temporary putting unit 46.

Subsequently, the Y-axis feeding mechanism 70 and the Z-axis feeding mechanism of the first conveying unit 64 are actuated and the first wafer holding part 62 is positioned above the simple wafer 12 sucked and supported by the support piece 40. Next, the air blowing members 86 of the first wafer holding part 62 and the simple wafer 12 sucked and supported by the support piece 40 are brought close to each other by lowering the first wafer holding part 62 by the Z-axis feeding mechanism of the first conveying unit 64 or raising the support piece 40 by the Z-axis feeding mechanism of the second conveying unit 142. Subsequently, the air supply means is actuated and air is blown from the air blowing members 86 to the simple wafer 12 to generate a negative pressure based on the Bernoulli effect and suck and hold the simple wafer 12 in a contactless manner by the first wafer holding part 62. Next, the suction force of the support piece 40 of the withdrawing unit 28 is deactivated to transfer the simple wafer 12 from the support part 26 of the withdrawing unit 28 to the first wafer holding part 62.

Subsequently, the Y-axis feeding mechanism 146 and the Z-axis feeding mechanism of the second conveying unit 142 are actuated and the support part 26 of the withdrawing unit 28 is separated from the first wafer holding part 62 that sucks and holds the simple wafer 12. Next, the pair of guide rails 48 of the first temporary putting unit 44 are positioned to the opening position by the guide rail opening-closing part 50.

Subsequently, the Y-axis feeding mechanism 70 and the Z-axis feeding mechanism of the first conveying unit 64 are actuated and the lower surface of the simple wafer 12 sucked and held by the first wafer holding part 62 is brought into contact with the upper surface of the chuck table 90 positioned directly under the second temporary putting unit 46 by the X-axis feeding mechanism 100. Next, the blowing of the air from the air blowing members 86 is stopped and the negative pressure of the first wafer holding part 62 is deactivated to transfer the simple wafer 12 to the chuck table 90. In this manner, the simple wafer 12 is conveyed from the second temporary putting unit 46 to the chuck table 90.

In the present embodiment, when the simple wafer 12 is positioned at the temporary putting table 54 of the second temporary putting unit 46, the detecting part 58 and the simple wafer 12 overlap as viewed in the upward-downward direction. Therefore, as described above, after the detection of the notch 22 of the simple wafer 12 that has been withdrawn from the second cassette 8 by the support part 26 of the withdrawing unit 28 and been positioned at the second temporary putting unit 46, the simple wafer 12 is supported by the support part 26 of the withdrawing unit 28 again and then the simple wafer 12 is transferred from the support part 26 to the first wafer holding part 62 of the first conveying unit 64. If the detecting part 58 is configured to be freely actuated between a detection-possible position at which the detecting part 58 overlaps with the simple wafer 12 as viewed in the upward-downward direction and an evacuation position at which the detecting part 58 does not overlap with the simple wafer 12 as viewed in the upward-downward direction, the simple wafer 12 positioned at the second temporary putting unit 46 may be held by the first wafer holding part 62 when the detecting part 58 is located at the evacuation position.

After the first wafer conveyance step is carried out, a cutting step of cutting the simple wafer 12 held by the chuck table 90 is carried out. In the cutting step, first, the simple wafer 12 is sucked and held by the upper surface of the chuck table 90. Subsequently, the simple wafer 12 is imaged by the imaging means (not depicted) and the planned dividing lines 18 of the simple wafer 12 are aligned with the X-axis direction based on an image of the simple wafer 12 imaged by the imaging means. In addition, the cutting blade 122 of each of the pair of cutting units 94 is positioned above the planned dividing line 18 aligned with the X-axis direction. Next, each cutting blade 122 is rotated together with each spindle 120 by each motor for the spindle.

Subsequently, the spindle housings 110 are lowered by the Z-axis feeding mechanisms 114 and the cutting edge of each cutting blade 122 is caused to cut into the planned dividing line 18 aligned with the X-axis direction from the front surface 12a of the wafer 12 to the depth equivalent to the thickness of the device chips (depth that does not reach the back surface 12b of the wafer 12). In addition, processing feed of the chuck table 90 is carried out in the X-axis direction relative to the cutting units 94 and cutting is carried out along the planned dividing lines 18 to carry out incomplete cutting processing of incompletely cutting the simple wafer 12.

Subsequently, the incomplete cutting processing is repeated while indexing feed of each cutting unit 94 is carried out in the Y-axis direction relative to the chuck table 90 by the interval of the planned dividing lines 18 in the Y-axis direction, and all of the planned dividing lines 18 aligned with the X-axis direction are incompletely cut. Next, after the chuck table 90 is rotated by 90 degrees, the incomplete cutting processing is repeated while indexing feed is carried out, and all of the planned dividing lines 18 orthogonal to the planned dividing lines 18 for which the incomplete cutting processing has been carried out previously are incompletely cut. In this manner, the side of the front surface 12a of the simple wafer 12 held by the chuck table 90 is cut and the cut grooves (not depicted) with the depth that does not reach the back surface 12b of the simple wafer 12 are formed along the planned dividing lines 18 in a lattice manner. In the cut simple wafer 12, the planned dividing lines 18 are not completely cut and dividing into device chips of each individual device 20 is not carried out. Therefore, the state in which the device chips that should be divided are joined to each other is kept.

After the cutting step is carried out, a second wafer conveyance step of holding the cut simple wafer 12 by the second wafer holding part 140 of the second conveying unit 142 and conveying the simple wafer 12 from the chuck table 90 to the cleaning unit 124 is carried out.

In the second wafer conveyance step, first, the chuck table 90 is positioned directly under the first temporary putting unit 44 by the X-axis feeding mechanism 100. Subsequently, the suction force of the chuck table 90 is deactivated. Furthermore, the Y-axis feeding mechanism 70 and the Z-axis feeding mechanism of the first conveying unit 64 are actuated as appropriate and the first wafer holding part 62 that has conveyed the simple wafer 12 in the first wafer conveyance step is moved to such a position as not to hinder the second wafer conveyance step.

Subsequently, the Y-axis feeding mechanism 146 of the second conveying unit 142 is actuated and the second wafer holding part 140 is positioned above the simple wafer 12 placed on the chuck table 90. Next, the pair of guide rails 48 of the first temporary putting unit 44 are positioned to the opening position and the second wafer holding part 140 is lowered by the Z-axis feeding mechanism of the second conveying unit 142 to bring the second wafer holding part 140 close to the simple wafer 12. In addition, the simple wafer 12 is sucked and held in a contactless manner by the second wafer holding part 140.

Subsequently, the second wafer holding part 140 is raised by the Z-axis feeding mechanism of the second conveying unit 142. Thereafter, the Y-axis feeding mechanism 146 of the second conveying unit 142 is actuated and the simple wafer 12 sucked and held by the second wafer holding part 140 is positioned above the spinner table 128 of the cleaning unit 124. Next, the second wafer holding part 140 is lowered by the Z-axis feeding mechanism of the second conveying unit 142 and the lower surface of the simple wafer 12 sucked and held by the second wafer holding part 140 is brought into contact with the upper surface of the spinner table 128 positioned at the upper putting-removing position. Subsequently, the suction force of the second wafer holding part 140 is deactivated to transfer the simple wafer 12 to the spinner table 128. In this manner, the cut simple wafer 12 is conveyed from the chuck table 90 to the cleaning unit 124.

After the second wafer conveyance step is carried out, a cleaning step of holding the cut simple wafer 12 by the cleaning unit 124 and cleaning the simple wafer 12 is carried out. In the cleaning step, first, the simple wafer 12 is sucked and held by the upper surface of the spinner table 128. Subsequently, the spinner table 128 is lowered from the upper putting-removing position to the lower cleaning position by the spinner table raising-lowering means. Next, after the cleaning water nozzle 134 is positioned from the non-operation position to the operation position, the cleaning water is injected from the cleaning water nozzle 134 toward the cut simple wafer 12 while the spinner table 128 is rotated by the motor for the spinner table. Thereby, the simple wafer 12 can be cleaned and cutting dust can be removed. In addition, the cleaning water can be removed from the upper surface (front surface 12a) of the simple wafer 12 by a centrifugal force due to the rotation of the spinner table 128.

Subsequently, the cleaning water nozzle 134 is positioned from the operation position to the non-operation position and the air nozzle 136 is positioned from the non-operation position to the operation position. Then, the drying air is injected from the air nozzle 136 toward the simple wafer 12. This can remove the cleaning water that has not been completely removed by the centrifugal force due to the rotation of the spinner table 128 from the upper surface of the simple wafer 12 and dry the simple wafer 12. Thereafter, the air nozzle 136 is positioned from the operation position to the non-operation position and the spinner table 128 is positioned from the lower cleaning position to the upper putting-removing position. Then, the suction force of the spinner table 128 is deactivated.

After the cleaning step is carried out, a third wafer conveyance step of holding the simple wafer 12 cleaned by the cleaning unit 124 by the first wafer holding part 62 of the first conveying unit 64 and conveying the simple wafer 12 from the cleaning unit 124 to the support part 26 of the withdrawing unit 28 is carried out.

In the third wafer conveyance step, first, the Y-axis feeding mechanism 146 and the Z-axis feeding mechanism of the second conveying unit 142 are actuated as appropriate and the second wafer holding part 140 is separated from the cleaning unit 124. Subsequently, the Y-axis feeding mechanism 70 of the first conveying unit 64 is actuated and the first wafer holding part 62 is positioned above the simple wafer 12 placed on the spinner table 128. Subsequently, the first wafer holding part 62 is lowered by the Z-axis feeding mechanism of the first conveying unit 64 and the first wafer holding part 62 is brought close to the simple wafer 12. In addition, the simple wafer 12 is sucked and held in a contactless manner by the first wafer holding part 62. Next, the first wafer holding part 62 is raised by the Z-axis feeding mechanism of the first conveying unit 64 and the simple wafer 12 sucked and held by the first wafer holding part 62 is separated upward from the spinner table 128.

Subsequently, the Y-axis feeding mechanism 70 of the first conveying unit 64 is actuated and the simple wafer 12 sucked and held by the first wafer holding part 62 is caused to pass above the lower-surface air blow member 166. At this time, the drying air is injected from the injection ports 168 of the air blow member 166 toward the lower surface of the simple wafer 12. This can remove the cleaning water from the lower surface of the simple wafer 12 and dry the lower surface of the simple wafer 12.

Moreover, the Y-axis feeding mechanism 70 of the first conveying unit 64 is actuated and the Y-axis feeding mechanism 146 and the Z-axis feeding mechanism of the second conveying unit 142 are actuated. Thereby, the support piece 40 of the support part 26 of the withdrawing unit 28 is positioned under the simple wafer 12 held by the first wafer holding part 62 of the first conveying unit 64. At this time, the support piece 40 is positioned to the operation position and the pivot member 32 of the clamping part 24 is positioned to the non-operation position. Subsequently, the upper surface of the support piece 40 of the withdrawing unit 28 is brought into tight contact with the lower surface of the simple wafer 12 held by the first wafer holding part 62 by lowering the first wafer holding part 62 by the Z-axis feeding mechanism of the first conveying unit 64 or raising the withdrawing unit 28 by the Z-axis feeding mechanism of the second conveying unit 142. In addition, the wafer 12 is sucked and supported by the upper surface of the support piece 40. Next, the blowing of the air from the air blowing members 86 is stopped and the negative pressure of the first wafer holding part 62 is deactivated to transfer the simple wafer 12 to the support piece 40 of the withdrawing unit 28. In this manner, the simple wafer 12 cleaned by the cleaning unit 124 is conveyed from the cleaning unit 124 to the support part 26 of the withdrawing unit 28.

After the third wafer conveyance step is carried out, a fourth wafer conveyance step of conveying the simple wafer 12 conveyed to the support part 26 of the withdrawing unit 28 to the second cassette 8 and housing the simple wafer 12 is carried out.

In the fourth wafer conveyance step, first, the Y-axis feeding mechanism 146 and the Z-axis feeding mechanism of the second conveying unit 142 are actuated and the simple wafer 12 sucked and supported by the support piece 40 of the support part 26 is conveyed to the second cassette 8. Subsequently, after the suction force of the support piece 40 is deactivated, the support piece 40 is slightly lowered by the Z-axis feeding mechanism of the second conveying unit 142 to separate the support piece 40 downward from the lower surface of the simple wafer 12. Thereby, the simple wafer 12 is caused to be supported by the second cassette 8. Then, the Y-axis feeding mechanism 146 of the second conveying unit 142 is actuated and the support piece 40 is withdrawn from the second cassette 8. In the fourth wafer conveyance step, the Y-axis feeding mechanism 70 and the Z-axis feeding mechanism of the first conveying unit 64 are actuated as appropriate and the first wafer holding part 62 is moved to such a position as not to hinder the fourth wafer conveyance step.

Then, for the simple wafer 12 incompletely cut by the cutting apparatus 2, a protective tape (not depicted) for protecting the devices 20 is stuck to the front surface 12a and the back surface 12b is ground by a grinding apparatus (not depicted) until the cut grooves appear in the back surface 12b. Thereby, the simple wafer 12 is divided into the device chips of each individual device 20.

The cutting methods are as described above. In the present embodiment, both of complete cutting of the wafer 12 of the frame unit 16 and incomplete cutting of the simple wafer 12 can be carried out by one cutting apparatus 2, which is economical. In addition, increase in the setting area of the cutting apparatus 2 can be suppressed.

Incidentally, in the cutting step, cutting dust generated when the wafer 12 is cut adheres to the frame unit 16 or the simple wafer 12. Regarding this point, in the case of cutting the wafer 12 of the frame unit 16 by using the cutting apparatus 2, the frame unit 16 to which cutting dust does not adhere before cutting and after cleaning is conveyed by the first frame holding part 60 in the first and third ring-shaped frame conveyance steps. In addition, the frame unit 16 to which cutting dust adheres after the cutting of the wafer 12 is conveyed by the second frame holding part 138 in the second ring-shaped frame conveyance step. Thus, cutting dust can be prevented from adhering to the first frame holding part 60 for conveying the frame unit 16 to which cutting dust does not adhere, and cutting dust can be prevented from adhering again to the frame unit 16 after cleaning.

Furthermore, the above-described point is also similar in the case of cutting the simple wafer 12 by using the cutting apparatus 2. The simple wafer 12 to which cutting dust does not adhere before cutting and after cleaning is conveyed by the first wafer holding part 62 in the first and third wafer conveyance steps. In addition, the simple wafer 12 to which cutting dust adheres after cutting is conveyed by the second wafer holding part 140 in the second wafer conveyance step. Thus, cutting dust can be prevented from adhering to the first wafer holding part 62 for conveying the simple wafer 12 to which cutting dust does not adhere, and cutting dust can be prevented from adhering again to the simple wafer 12 after cleaning.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus that cuts a wafer, comprising:
    a cassette table on which a first cassette in which a frame unit, in which a wafer is positioned in an opening of a ring-shaped frame having the opening and the ring-shaped frame and the wafer are integrated by an adhesion tape, is housed and a second cassette in which a simple wafer is housed are selectively placed;
    a withdrawing unit selectively including a clamping part that clamps the ring-shaped frame and withdraws the frame unit from the first cassette when the first cassette is placed on the cassette table and a support part that supports the simple wafer and withdraws the simple wafer from the second cassette when the second cassette is placed on the cassette table;
    a first temporary putting unit on which the frame unit withdrawn by the clamping part of the withdrawing unit is temporarily put;
    a second temporary putting unit on which the simple wafer withdrawn by the support part of the withdrawing unit is temporarily put;
    a first conveying unit including a first frame holding part that holds the ring-shaped frame of the frame unit positioned at the first temporary putting unit and conveys the frame unit to a chuck table and a first wafer holding part that holds the simple wafer positioned at the second temporary putting unit and conveys the simple wafer to the chuck table;
    a cutting unit that cuts the wafer of the frame unit or the simple wafer held by the chuck table;
    a cleaning unit that holds and cleans the wafer of the frame unit or the simple wafer that has been cut; and
    a second conveying unit including a second frame holding part that holds the ring-shaped frame of the frame unit of the cut wafer and conveys the frame unit from the chuck table to the cleaning unit and a second wafer holding part that holds the cut simple wafer and conveys the simple wafer from the chuck table to the cleaning unit.

2. The cutting apparatus according to claim 1, wherein the first frame holding part of the first conveying unit holds the ring-shaped frame of the frame unit cleaned by the cleaning unit and conveys the frame unit from the cleaning unit to the first temporary putting unit, and the first wafer holding part of the first conveying unit holds the simple wafer cleaned by the cleaning unit and conveys the simple wafer from the cleaning unit to the support part of the withdrawing unit.

3. The cutting apparatus according to claim 1, wherein the second temporary putting unit includes a detecting part that detects a crystal orientation of the simple wafer.

4. The cutting apparatus according to claim 1, wherein the first frame holding part of the first conveying unit and the second frame holding part of the second conveying unit suck and hold the ring-shaped frame, and the first wafer holding part of the first conveying unit and the second wafer holding part of the second conveying unit blow air to the simple wafer to generate a negative pressure and hold the simple wafer in a contactless manner.

5. The cutting apparatus according to claim 1, wherein by the cutting unit, the wafer of the frame unit is completely cut and the simple wafer is incompletely cut.

6. The cutting apparatus according to claim 1, wherein the second conveying unit includes the withdrawing unit.

7. The cutting apparatus according to claim 1, wherein the first temporary putting unit has a pair of guide rails that are selectively positioned to a closing position at which the pair of guide rails support the frame unit and an opening position with which the frame unit is released, and
    the frame unit withdrawn from the first cassette is supported by the pair of guide rails positioned at the closing position and, after the supporting, the frame unit is held by the first frame holding part of the first conveying unit and the pair of guide rails are positioned to the opening position, and the frame unit is conveyed to the chuck table positioned directly under the first temporary putting unit.

8. The cutting apparatus according to claim 1, wherein the second temporary putting unit is disposed on an upper side and on a side of the cassette table relative to the first temporary putting unit, and
    the simple wafer that has been withdrawn from the second cassette by the support part of the withdrawing unit and been positioned at the second temporary putting unit is, after detection of a notch, supported by the support part again and is held by the first wafer holding part of the first conveying unit to be conveyed to the chuck table positioned directly under the first temporary putting unit.

* * * * *